(12) United States Patent
Waheed et al.

(10) Patent No.: US 8,295,396 B2
(45) Date of Patent: *Oct. 23, 2012

(54) SYSTEM AND METHOD FOR POWER CONTROL IN A WIRELESS TRANSMITTER

(75) Inventors: Khurram Waheed, Plano, TX (US); Tim Foo, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 433 days.

This patent is subject to a terminal disclaimer.

(21) Appl. No.: 12/235,340

(22) Filed: Sep. 22, 2008

(65) Prior Publication Data

US 2009/0054018 A1  Feb. 26, 2009

Related U.S. Application Data

(63) Continuation-in-part of application No. 11/968,003, filed on Dec. 31, 2007, now Pat. No. 8,073,074.

(60) Provisional application No. 60/957,364, filed on Aug. 22, 2007.

(51) Int. Cl.
*H04L 25/03* (2006.01)
*H04L 23/00* (2006.01)

(52) U.S. Cl. ........................... 375/297; 375/377

(58) Field of Classification Search .......... 375/205–297, 375/377; 455/91, 114.2, 114.3; 332/106, 332/107, 123, 124, 159, 160, 162

See application file for complete search history.

(56) References Cited

U.S. PATENT DOCUMENTS

| | | | |
|---|---|---|---|
| 7,151,405 B2 * | 12/2006 | Nezami | 330/149 |
| 7,817,970 B2 * | 10/2010 | Puma | 455/114.3 |
| 2001/0040720 A1 * | 11/2001 | Gerrish et al. | 359/341.4 |
| 2002/0186783 A1 * | 12/2002 | Opas et al. | 375/297 |
| 2002/0196864 A1 * | 12/2002 | Booth et al. | 375/296 |
| 2006/0109930 A1 * | 5/2006 | O'Sullivan et al. | 375/296 |

* cited by examiner

*Primary Examiner* — Tesfaldet Bocure

(74) *Attorney, Agent, or Firm* — Ronald O. Neerings; Wade James Brady, III; Frederick J. Telecky, Jr.

(57) ABSTRACT

A system and method for power control in a wireless transmitter. A power control loop includes a feed forward unit coupled to a data source, the feed forward unit processes a signal for transmission, a feedback unit coupled to the feed forward unit, the feedback unit generates a feedback signal representative of an output power level of the signal transmitted by the feed forward unit, a closed loop power control unit coupled to the feedback unit and to the feed forward unit, the closed loop power control unit generates an additive correction signal based on an error signal computed from the feedback signal and data provided by the data source or software instructions, and a ramp path power control unit coupled to the data source, the ramp path power control unit generates a multiplicative correction signal based on an additive correction signal and data provided by the data source.

17 Claims, 13 Drawing Sheets

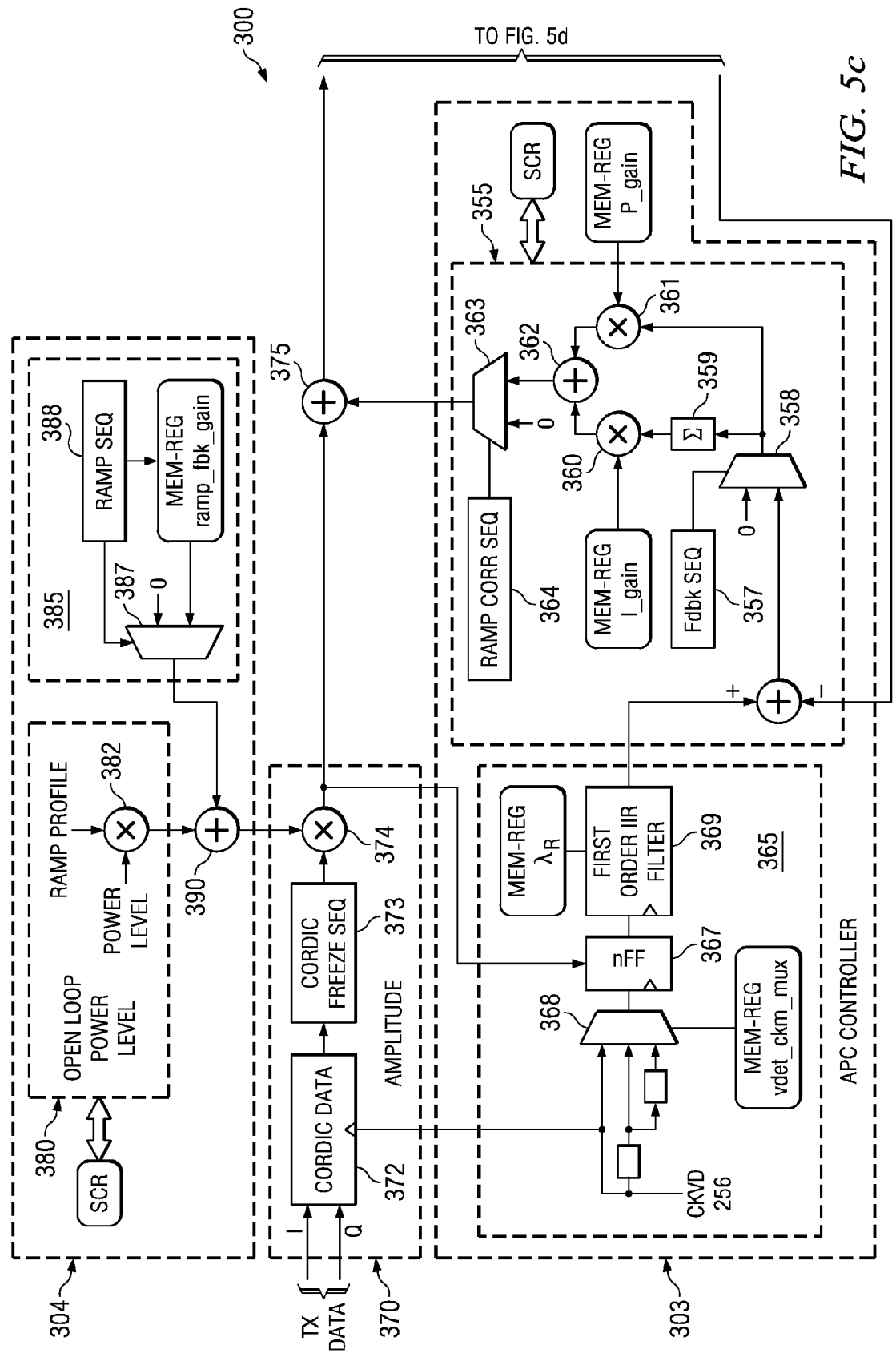

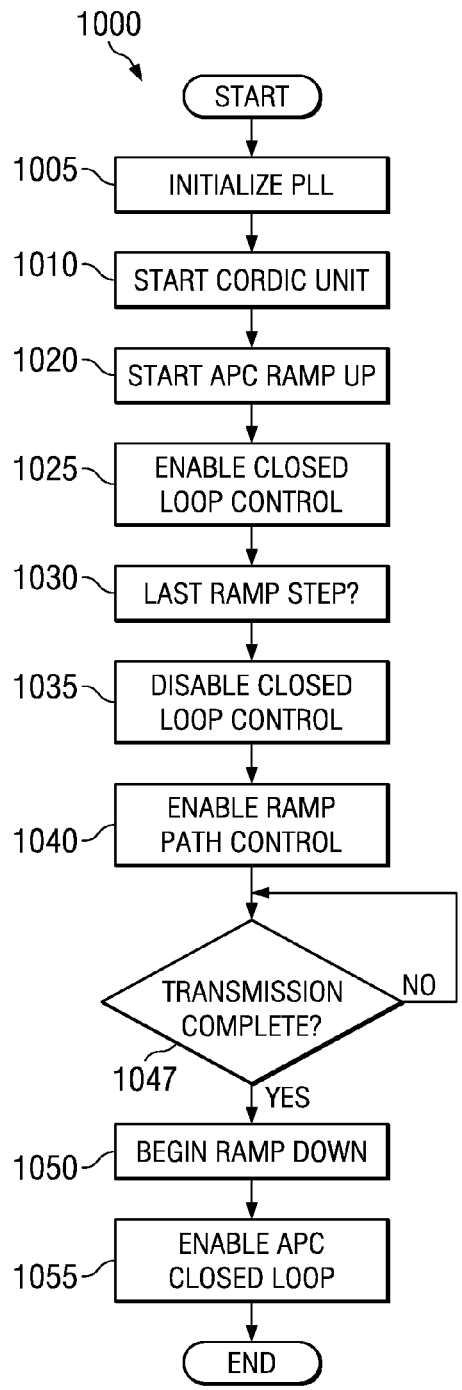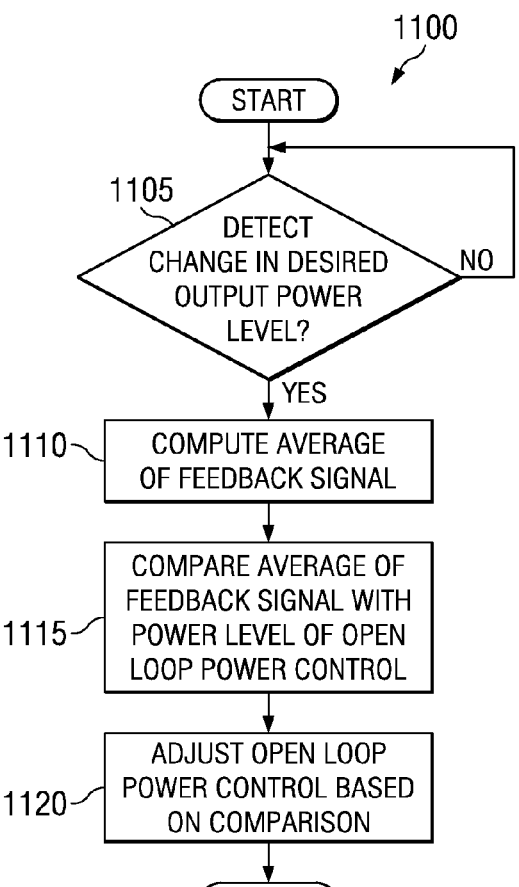
FIG. 10
FIG. 11

SYSTEM AND METHOD FOR POWER CONTROL IN A WIRELESS TRANSMITTER

This application is a Continuation-In-Part of application Ser. No. 11/968,003, filed on Dec. 31, 2007, now U.S. Pat. No. 8,073,074, which claims the benefit of U.S. Provision Application No. 60/957,364, filed on Aug. 22, 2007, entitled "Closed Loop Proportional Integral (PI) Controller Based Automatic Power and Ramp Control for a Polar Transmitter," and U.S. patent application Ser. No. 11/968,003, filed on Dec. 31, 2007, entitled "System and Method for Power Control in a Wireless Transmitter," which applications are hereby incorporated herein by reference.

TECHNICAL FIELD

The present invention relates generally to a system and method for wireless communications, and more particularly to a system and method for power control in a wireless transmitter.

BACKGROUND

Modern communications standards, such as Enhanced Data for GSM Evolution (EDGE), Wideband Code Division Multiple Access (WCDMA), Bluetooth-Enhanced Data Rate (BT-EDR), Wireless Local Area Network (WLAN), Worldwide Interoperability for Microwave Access (WiMAX), Long-Term Evolution (LTE), and so forth, employ complex envelope modulation schemes that impose strict performance requirements on transceivers. For example, these 2G and 3G and beyond communications standards implement power control schemes at multiple implementation layers to achieve optimized quality of service (QoS).

Accurate power level control of a wireless communications device's transmissions may ensure good interoperability along with other wireless communications devices and services sharing the same transmission medium, channel, base station, and so on. If a wireless communications device transmits at a higher power level than is needed, the wireless communications device may generate excessive noise that may negatively impact surrounding wireless communications devices, causing multiple access interference (MAI), for example. However, if the wireless communications device transmits at a lower power level than is needed, the transmission may be lost due to excessive error rates and may have transmission detectability issues, in general.

Generally, a wireless communications device may be calibrated for power level during a general calibration under normal operating conditions. However, a wireless communications device may be exposed to a wide variety of operating conditions, including but not limited to variations in operating temperature, battery voltage, operating frequency, load impedance, and so forth. These operating conditions may change during use. Therefore, if power control is operated in an open loop mode (e.g., without feedback control), the calibrated power levels may be unable to meet the stringent power level accuracy requirements of the above listed communications standards as well as additional quality of service restrictions imposed by wireless phone manufacturers and/or service providers.

Furthermore, communications standards operate in duplex (3G) or simplex (2G and 2.5G) modes in a time slot fashion. At the beginning and end of each time slot, the power level may be required to vary significantly. The abrupt power level change may have spectral implications that may impact other wireless communications devices operating in close proximity to a transmitting wireless communications device. For example, stringent transient spectral requirements, such as transient switching spectrum in EDGE and transient ACLR in WCDMA, may mandate the use of a ramping profile, which the wireless communications device is required to follow in order to meet the specified switching requirements. Again, open loop power control, due mainly to the inherent inadequacy of the calibrated power levels, may not be able to meet the specified spectral requirements.

SUMMARY OF THE INVENTION

These and other problems are generally solved or circumvented, and technical advantages are generally achieved, by embodiments of a system and a method for power control in a wireless transmitter In accordance with an embodiment, a power control loop is provided. The power control loop includes a feed forward unit coupled to a data source, a feedback unit coupled to the feed forward unit, a closed loop power control unit coupled to the feedback unit and to the feed forward unit, and a ramp path power control unit coupled to the data source. The feed forward unit processes a signal for transmission, the feedback unit generates a feedback signal representative of an output power level of the signal processed for transmission by the feed forward unit, the closed loop power control unit generates an additive correction signal based on an error signal computed from the feedback signal and data provided by the data source, where the additive correction signal is computed using a regulated control algorithm and the additive correction signal is added to the data, and the ramp path power control unit generates a multiplicative correction signal based on an additive correction signal and data provided by the data source, wherein the multiplicative correction signal is used to scale the data.

In accordance with another embodiment, a method for controlling power ramping is provided. The method includes starting the data unit to produce a specified value, and starting power ramp up with closed loop power control. The method also includes in response to a determining that the power ramp up is complete, disabling closed loop power control, enabling ramp path power control, and starting power ramp down.

In accordance with another embodiment, a method for controlling output power level in a transmitter is provided. The method includes determining a signal related to the output power level of the transmitter and correcting the signal. The method also includes in response to a determining that the signal differs from a desired output power level by more than a threshold, using closed loop power control to compute an additive correction signal used to adjust a control signal affecting the output power level, and applying the additive correction signal to the control signal. The method further includes in response to a determining that the signal differs from the specified value by less than the threshold, disabling closed loop power control, saving the additive correction signal, using open loop power control to compute a multiplicative correction signal used to adjust the control signal affecting the output power level, and applying the multiplicative correction signal to the control signal.

In accordance with another embodiment, a method for controlling an output power level of a transmitter is provided. The method includes detecting a change in a desired output power level, computing an average of a feedback signal, and adjusting the output power level of the transmitter in response to a determining that the average of the feedback signal and the desired output power level differs by more than a threshold.

In accordance with another embodiment, a power control loop is provided. The power control loop includes a feed forward unit coupled to a data unit, a feedback unit coupled to the feed forward unit, and a closed loop power control unit coupled to the feedback unit and to the feed forward unit. The feed forward unit processes a data stream from the data unit for transmission, the feedback unit generates a feedback signal representative of an output power level of the data stream processed for transmission by the feed forward unit, and the closed loop power control unit generates an additive correction signal based on an error signal computed from the feedback signal.

An advantage of an embodiment is that the digital nature of the closed loop power control provides a high degree of versatility and flexibility not possible with an analog implementation. For example, parameters of the power control may be changed dynamically to meet changing requirements, without requiring a redesign of the power control mechanism. Furthermore, the digital nature makes the closed loop power control less susceptible to varying performance typical of analog implementations.

A further advantage of an embodiment is that additional algorithmic layers, for parameter based compensation, for example, may be added if needed without requiring a redesign of the power control mechanism. Additionally, the closed loop power control has the flexibility of operating with different wireless communications standards, both existing and proposed, as well as the ability to meet varying external component requirements.

Yet another advantage of an embodiment is that feedback linearization may be used with not only a power amplifier of a wireless communications device, but any analog module in the wireless communications devices as well as analog-to-digital converter non-linearities may be addressed and corrected.

The foregoing has outlined rather broadly the features and technical advantages of the present invention in order that the detailed description of the embodiments that follow may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the embodiments, and the advantages thereof, reference is now made to the following descriptions taken in conjunction with the accompanying drawings, in which:

FIG. 5c is a diagram of a portion of power control hardware/software/firmware in a polar transceiver having a filter in a feedback path;

FIG. 10 is a diagram of a sequence of events in power control of an output signal during a transmission;

FIG. 11 is a diagram of a sequence of events in self-calibrating a digital polar transmitter.

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely a wireless communications device adherent to a 2G or 3G cellular communications standard, such as Enhanced Data for GSM Evolution (EDGE), Wideband Code Division Multiple Access (WCDMA), Bluetooth-Enhanced Data Rate (BT-EDR), Wireless Local Area Network (WLAN), Worldwide Interoperability for Microwave Access (WiMAX), Long-Term Evolution (LTE), and so forth. The invention may also be applied, however, to other wireless communications devices adherent to other cellular communications standards, as well as to wireless transmitters operating in environments with strict power level requirements, power ramping requirements, spectral requirements, and so forth.

Figure 1:
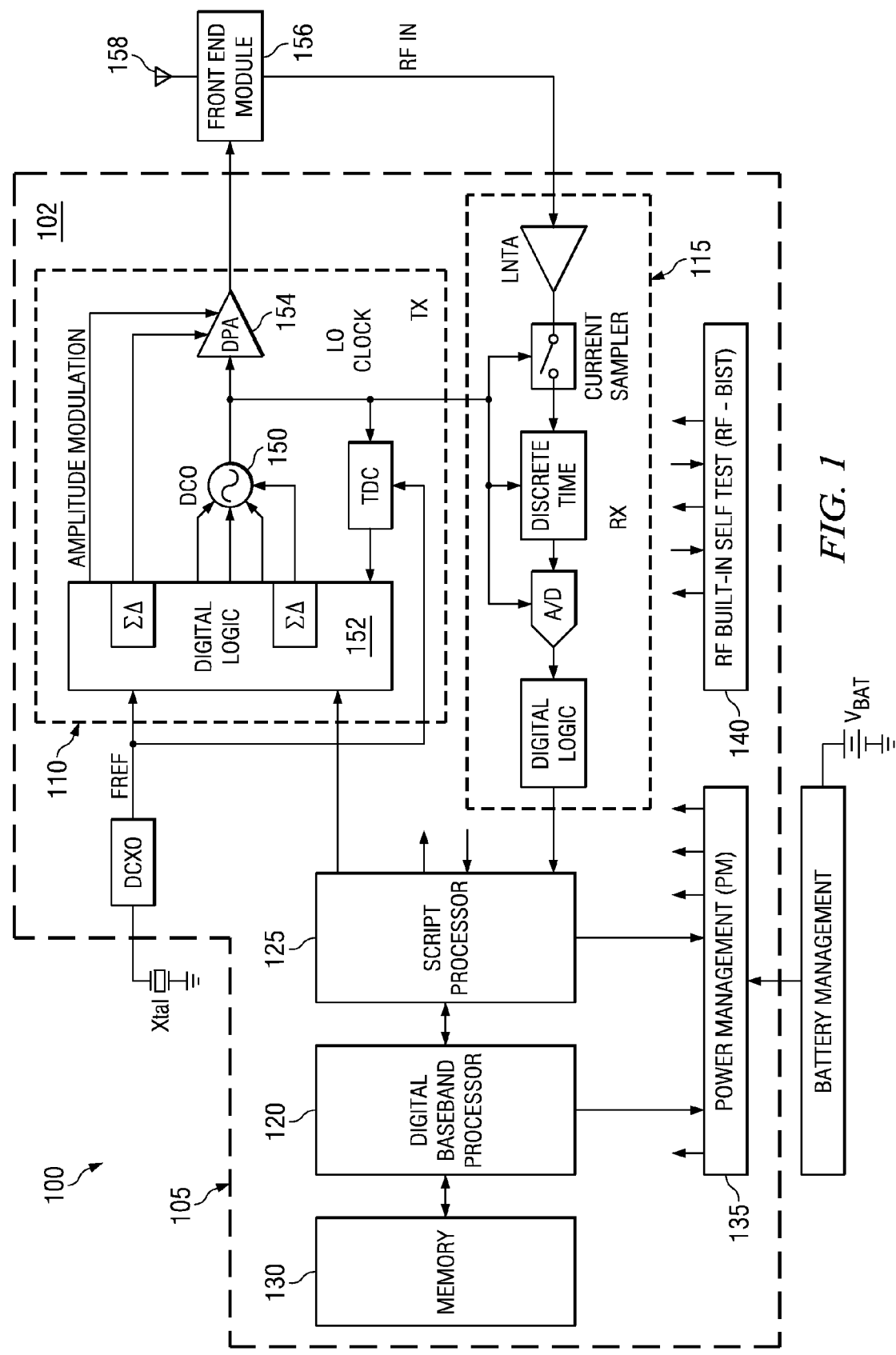
FIG. 1 is a diagram of a wireless communications device.

With reference now to FIG. 1, there is shown a diagram of a wireless communications device 100 containing a radio integrated circuit chip 102. The radio integrated circuit chip 102 further contains a polar transceiver 105. The polar transceiver 105 includes a transmitter 110 and a receiver 115. The polar transceiver 105 also includes a digital baseband processor 120 to process signals to be transmitted and/or received by the polar transceiver 105, a script processor 125 to execute algorithms and functions in the polar transceiver 105, a memory 130 to store data, configuration parameters, programs, and so forth. The polar transceiver 105 further includes a power management circuit 135 to condition and stabilize a power supply for the polar transceiver 105 and radio frequency built-in self test circuit 140 to perform autonomous testing, such as phase noise and modulation distortion, as well as various loopback configurations for bit error rate measurements. Although the discussion focuses on a polar transmitter, the embodiments have application with other forms of transmitters, such as Cartesian transmitters. Therefore, the discussion of polar transmitters should not be construed as being limiting to either the scope or the spirit of the embodiments.

Central to the polar transceiver 105 is a digital controlled oscillator (DCO) 150. The DCO 150 deliberately avoids analog tuning controls. Fine frequency resolution may be achieved through high-speed sigma-delta (ΣΔ) dithering of varactors of the DCO 150. Digital logic 152 built around the DCO 150 realizes an all-digital PLL (ADPLL) that may be used as a local oscillator for both the transmitter 110 and the receiver 115. The polar architecture of the polar transceiver 105 may utilize a wideband direct frequency modulation capability of the ADPLL and a digitally controlled pre-power amplifier (DPA) 154 for power ramp and amplitude modulation. The DPA 154 may operate in near class E mode and makes use of an array of NMOS transistors to regulate the RF amplitude, for example, high-speed sigma-delta dithering of the NMOS transistors may achieve fine amplitude resolution of a transmitted signal.

The wireless communications device 100 also contains a matching network and an external front end module 156. The external front end module 156 comprises a power amplifier (PA) and a transmit/receive switch for a common antenna 158. The receiver 115 may employ a discrete time architecture in which a received RF signal is directly sampled at Nyquist rate of the received RF signal's RF carrier and processed using analog and digital signal processing techniques.

Figure 2:
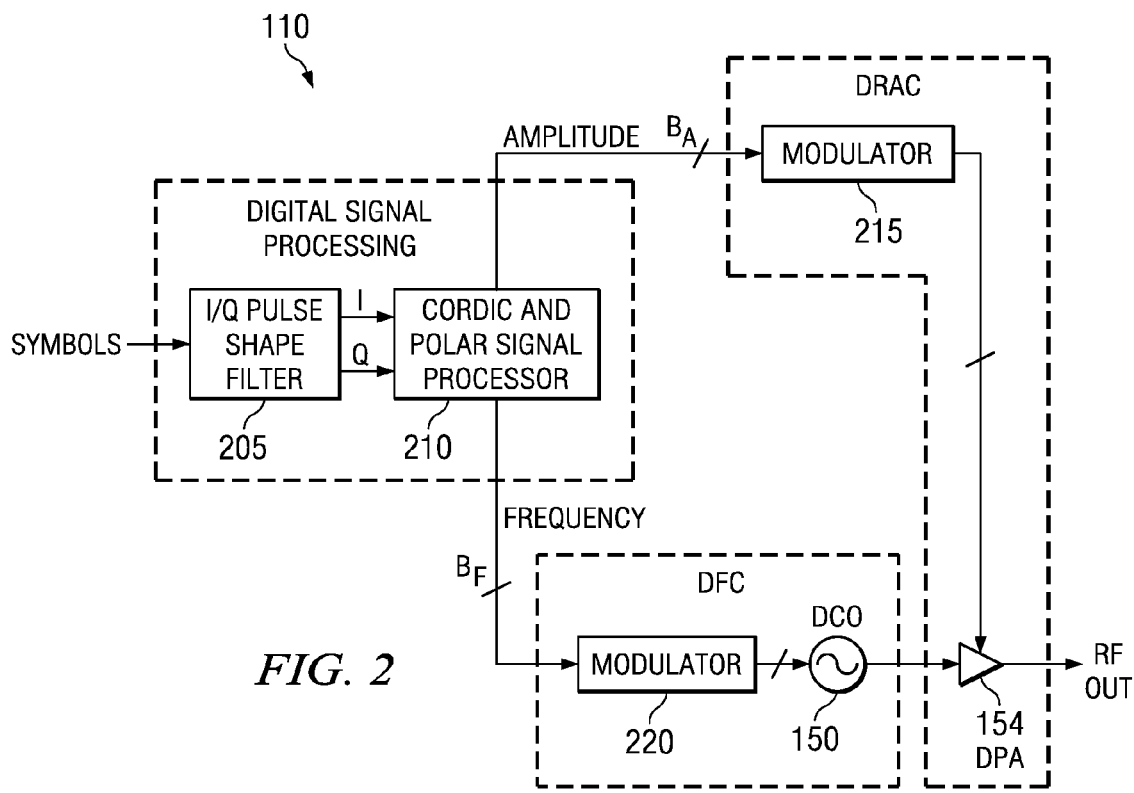
FIG. 2 is a diagram of a high-level view of a small-signal polar transmitter.

FIG. 2 illustrates a high-level view of the transmitter 110. The transmitter 110 is a polar transmitter and implements a polar transmitter's amplitude modulation and phase modulation in separate paths. Data, in the form of symbols, to be transmitted may be generated in the digital baseband processor 120 and may be first pulse-shape filtered in a Cartesian coordinate system by an I/Q pulse-shape filter 205 and then converted using a CORDIC algorithm in a signal processor 210 into amplitude and phase samples. The phase samples may then be differentiated to obtain a frequency deviation. The amplitude samples and the differentiated phase samples may then be modulated in modulators 215 (amplitude samples) and 220 (differentiated phase samples) using a RF carrier signal, such as a LO signal produced by the DCO 150 prior to being amplified by the DPA 154.

Figure 3A:
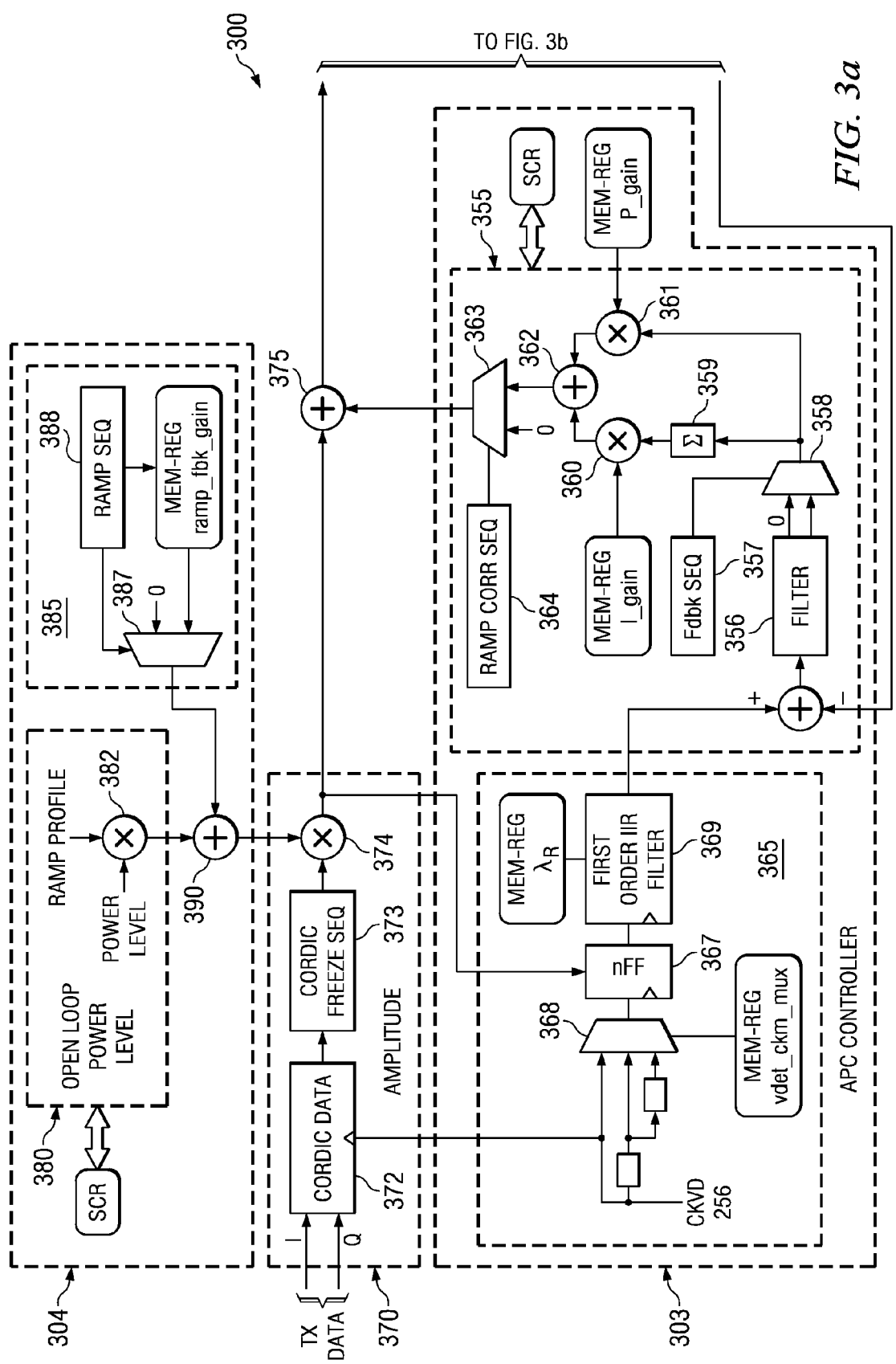
FIG. 3a is a diagram of a portion of detailed view of power control hardware/software/firmware in a polar transceiver.
Figure 3B:
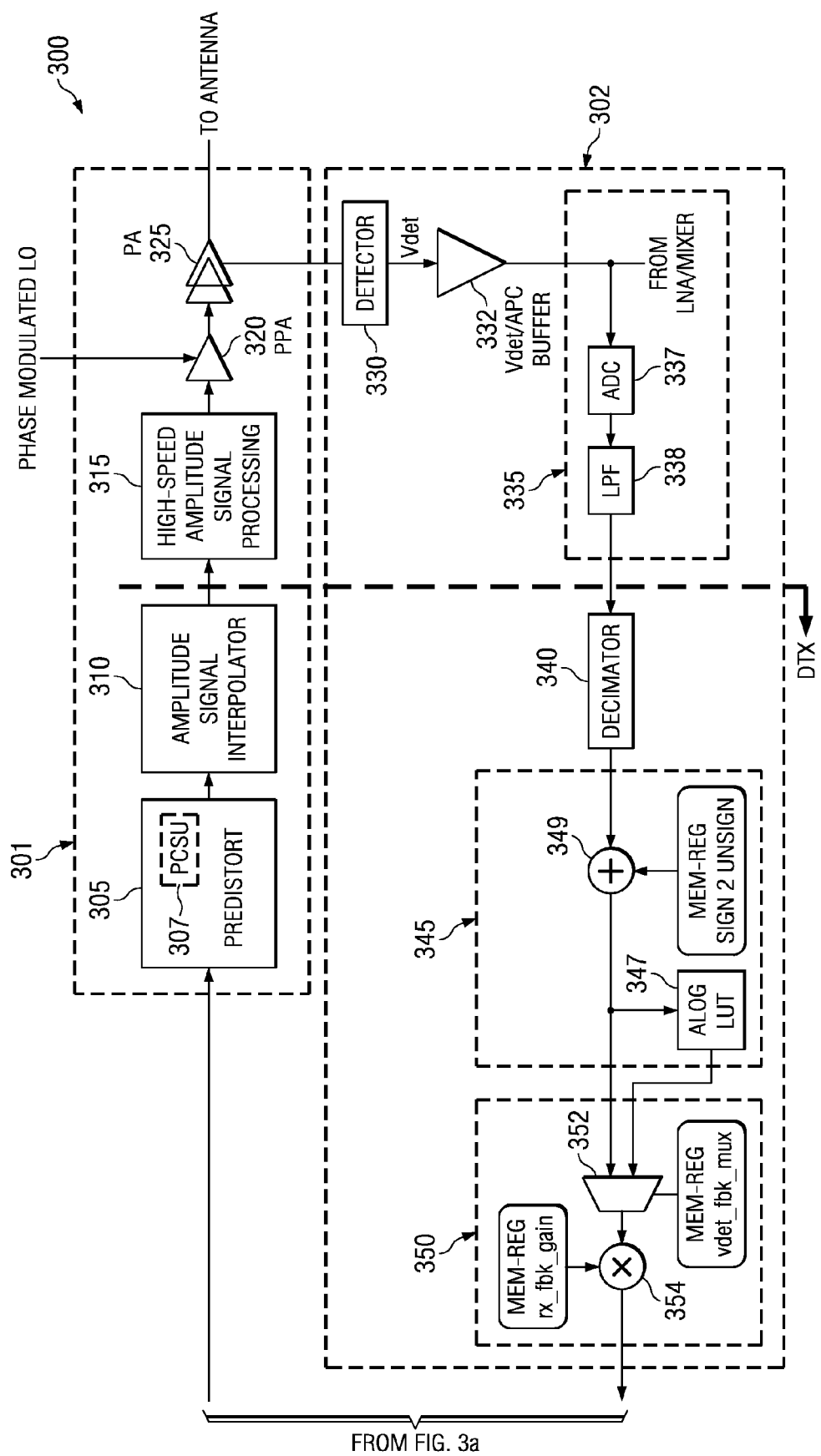
FIG. 3b is a diagram of a portion of a detailed view of power control hardware/software/firmware in a polar transceiver.

FIGS. 3a and 3b illustrate a detailed view of power control hardware/software/firmware in a polar transceiver 300. The power control may be implemented in hardware, software, firmware, or a combination thereof. The power control hardware/software/firmware may be partitioned into several components: a feed forward portion 301, a feedback portion 302, a closed loop power control portion 303, and a ramp path power control portion 304.

The feed forward portion 301 of the loop power control in the polar transceiver 300 includes a predistort unit 305. The predistort unit 305 may be used for linearization of a transmitter of the polar transceiver 300 and may predistort the AM path, the PM path, or both the AM and the PM path. An interpolation filter 310 may be used to upsample the AM and PM samples. A high-speed sigma-delta amplitude modulator (SAM) 315 may be used to modulate the AM samples which may then be provided to a pre-power amplifier (PPA) 320. While the PM samples may be used to modulate a carrier LO signal by way of a digital local oscillator (DLO) and the digitally controlled oscillator (DCO). A phase modulated output of the DCO may also be provided to the PPA 320, the PPA 320 may be used to combine the AM and PM samples to compute a complex RF output, which may be provided to a PA 325 for signal amplification prior to transmission over-the-air by an antenna.

Alternatively, the feed forward portion 301 of the loop power control in the polar transceiver 300 includes a power control slope unit (PCSU)(307). The power control slope unit may provide a power slope correction for amplifiers in the feed forward portion 301, such as the PPA 320 and/or the PA 325. The correction may be used to correct for changes in the slope of the amplifiers due to changes in operation conditions, such as temperature, loading, voltage, and so on.

The feedback portion 302 includes a detector 330, a digitizer 335, a decimator 340, a non-linear corrector 345, and a signal gain unit 350. The detector 330, such as a power detector, that may provide feedback information about the output of the PA 325. The detector 330 may be implemented in the PA 325 or a front end module, such as the front end module 156 (FIG. 1). For example, the detector 330 may produce a voltage signal, Vdet. The voltage signal Vdet may be a single-ended signal or a differential signal. Depending on implementation, a buffer 332 may be used to convert the voltage signal Vdet from a single-ended signal into a differential signal. The voltage signal Vdet, may then be provided to a digitizer 335, which may convert the voltage signal Vdet into a digital signal with an analog-to-digital converter (ADC) 337 and may perform filtering on the digitized signal with a filter 338. A low-pass filter (LPF) may be used to filter the digitized signal, for example.

The detector 330 may be implemented in the PPA 320. With the detector 330 implemented in the PPA 320, the feedback portion 302 may be autonomous and may be internal to the radio integrated circuit chip 102.

Reusing existing hardware/software/firmware may reduce the need for additional hardware/software/firmware to the polar transceiver 300. As discussed above, the digitizer 335 may be used to digitize and filter the voltage signal Vdet. However, a receiver typically will also include an ADC and a filter. Therefore, it may be possible to utilize a receiver to perform the processing of the voltage signal Vdet. For example, if the polar transceiver 300 is operating in half-duplex mode, it may have a primary receiver that may be idle while its transmitter is transmitting. The primary receiver may then be used to digitize and filter the voltage signal Vdet. If the primary receiver is a quadrature receiver, then, the voltage signal Vdet may be provided to one of the two inputs to the primary receiver, either the in-phase (I) or the quadrature phase (Q) input. Alternatively, if the polar transceiver 300 has a secondary receiver, then the secondary receiver may be used to digitize and filter the voltage signal Vdet, regardless of the status of the primary receiver. The primary receiver may convert the voltage signal Vdet into a digital signal with an ADC and may perform filtering on the digitized signal with a filter. In addition to a receiver, if the polar transceiver 300 includes an ADC and/or a filter that may not be busy, the ADC and/or the filter may be used in power control.

The output of the digitizer 335 (the digitized voltage signal Vdet) may then be decimated by a specified amount by the decimator 340. After decimation, the digitized signal may then be provided to the non-linear corrector 345. The non-linear corrector 345 may be used to correct for non-linearities that may be present in the digitized signal arising from the detector 330. For example, the non-linear corrector 345 may include an antilog lookup table (LUT) 347 that may be used to correct for the non-linear behavior of a logarithmic detector used in the detector 330. However, since it may be implemented as a LUT rather than a mathematical function, the antilog LUT 347 may be used to correct for other forms of non-linear behavior. Since the antilog LUT 347 may be used to correct the behavior of the detector 330, an equivalent name may be Vdet compensation (VDETC) LUT. The discussion of the antilog LUT 347 provided above should not be construed as being limiting to either the scope or the spirit of the invention. The linearization (or compensation) of the power detector non-linearity may also be implemented as a mathematical function approximation.

Figure 4:
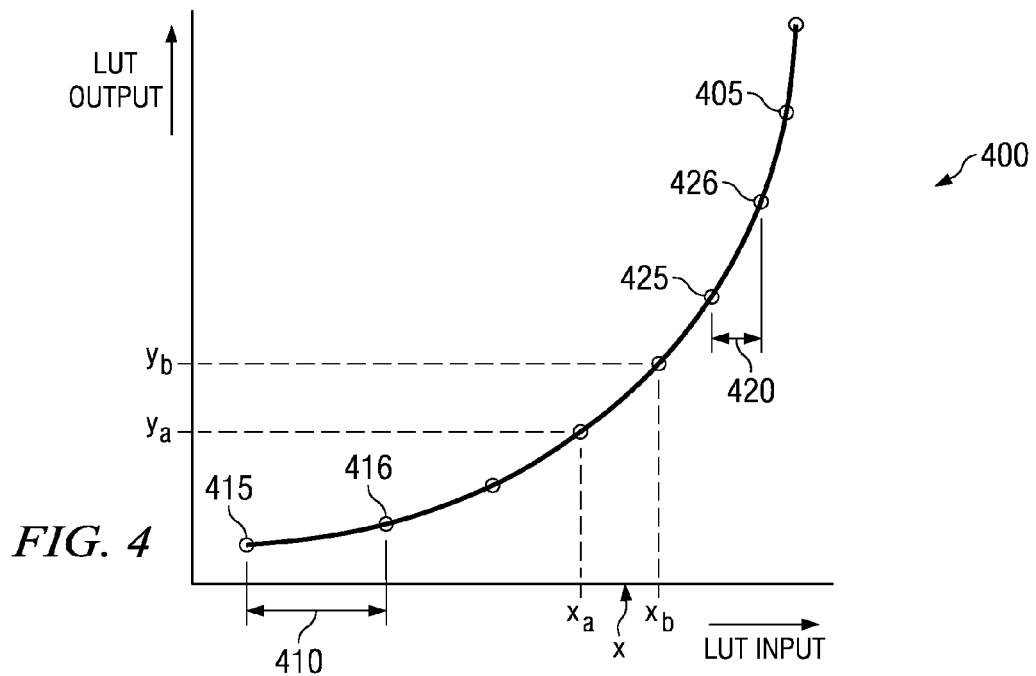
FIG. 4 is a diagram of a data plot of data in a lookup table for linearization of a feedback signal.

FIG. 4 illustrates a data plot 400 providing a graphical representation of data in the antilog LUT 347. An X-axis of the data plot 400 represents input to the antilog LUT 347 and the Y-axis of the data plot 400 represents output from the antilog LUT 347. A data point, such as data point 405, represents an actual entry in the antilog LUT 347. The data points may be evenly spaced along a possible range of inputs to the antilog LUT 347. Alternatively, the spacing of the data points may be varied depending on the mapping between the input and the output. For example, if for a first range of inputs the output does not vary significantly for changing input, then a small number of data points may be assigned to span the first range of inputs, resulting in a large separation between consecutive data points. However, if for a second range of inputs the output varies significantly for changing input, then a large number of data points may be assigned to span the second range of inputs, resulting in a small separation between consecutive data points. As shown in FIG. 4, a span 410 between data points 415 and 416 may be significantly larger than a span 420 between data points 425 and 426. The assignment of data points based on the mapping between the input and the output may result in a better approximation of the relationship between the input and the output. For example, a typical power detector may have characteristics that are logarithmic in nature, and use of exponential spacing between the entries of the LUT may provide a good fit that meets the performance requirement of the feedback across power level. Although the typical power detector may have logarithmic characteristics that may be corrected using the LUT, it may be possible for a power detector to have other non-linear characteristics. Furthermore, a power detector may have linear characteristics. The LUT may be used to correct for these other types of power detector behavior.

For an arbitrary input x to the antilog LUT 347, an output y may be calculated by 1) retrieving two data points from the antilog LUT 347 such that a first data point $x_a$ where $x_a \leq x$ and a second data point $x_b$ where $x_b > x$; 2) computing y using expression:

$$y = y_a + \left(\frac{y_b - y_a}{x_b - x_a}\right) \cdot (x - x_a),$$

where $y_a$ and $y_b$ are entries in the antilog LUT 347 corresponding to $x_a$ and $x_b$, respectively. The formula used to compute y makes use of linear interpolation to compute y from $y_a$, $y_b$, $x_a$, and $x_b$. However, interpolation using either zero-order hold (also known as nearest neighbor) or higher order polynomials may be used in place of linear interpolation. Furthermore, the non-linearity correction by the antilog LUT 347 may be other than logarithmic if the data in the antilog LUT 347 is changed. For example, if the digitized data possesses a non-linear behavior other than logarithmic, the antilog LUT 347 may be used to linearize the non-linear, non-logarithmic, or change a linear behavior of the digitized signal with use of appropriate data and interpolation technique. In general, by using appropriate data, the antilog LUT 347 may practically correct any form of non-linear behavior. Furthermore, the antilog LUT 347 may also be used to linearizer non-linearities in the feedback portion 302.

Turning back to FIGS. 3a and 3b, the non-linear corrector 345 may also be used to correct for behavior of the ADC 337. Typically, the voltage signal Vdet may be an unsigned value. However, a normal ADC 337 provides a signed value as its output. Therefore, the non-linear corrector 345 may also be used to convert the digitized signal from a signed value to an unsigned value. This may be realized by adding (using an adder 349) a constant value to the digitized signal. The constant value may be known a priori and stored in a memory or a register, for example. In addition to a conversion from a signed value to an unsigned value, the non-linear corrector 345 may also be used to eliminate any DC offset that may be present in the voltage signal Vdet. The use of the non-linear corrector 345 to eliminate DC offset may also be used to help improve the quantization floor of the antilog LUT 347 through artificially manipulating the DC level in the feedback portion 302.

It may be possible that output power control may be formed in the power domain. In this situation, corrections performed in the non-linear corrector 345 may be applied in the power domain, which may be expressed in dB or a logarithm of the voltage domain.

After linearizing, the digitized signal may be scaled in the signal gain unit 350. The signal gain unit 350 includes a multiplexer 352 that may be used in selected which digitized signal to feedback, either a linearized digitized signal or a non-linearized digitized signal, with the digitized signal being selected by a value, Vdet_fbk_mux. The digitized signal may then be scaled by multiplying the digitized signal with a scaling factor, rx_fbk_gain, in a multiplier 354.

The selectivity provided by the multiplexer 352 may allow for additional flexibility in the processing and manipulation of the feedback information from the detector 330. For example, a software application may be used in place off or in addition to the conversion of the digitized signal from a signed value to an unsigned value. The software application may execute in the processor 125, for example, and may perform operations and optimizations such as filtering, averaging, and so forth. The multiplexer 352 may be able to select the feedback information to provide to the closed loop power control portion 303.

Once scaled, the digitized signal may be provided to the closed loop power control portion 303, which includes an APC controller 355 and a feedback sequencer unit 365, where it may be subtracted from a delayed version of a ramp input, DTX_ACW, producing an error signal. The delayed version of the ramp input may be provided by the feedback sequencer unit 365. The feedback sequencer unit 365 includes a programmable delay unit 367. The programmable delay unit 367 may be implemented as multiple flip flops, for example, that may be clocked with a clock signal selectable from several clocks using a multiplexer 368. The programmable delay unit 367 may delay a ramp input from either a Cordic unit 370 or an open loop power control unit 380. The delayed ramp input may also be filtered by a filter 369. The filter 369 may be implemented as a first order infinite impulse response (IIR) filter, but other filter orders may be used as well as other filter types.

In addition to providing data, the feedback sequencer unit 365 may, depending on application, provide commands, such as software commands, to the closed loop power control portion 303. For example, the feedback sequencer unit 365 may provide power level commands to the closed loop power control portion 303.

The Cordic unit 370 includes a Cordic data unit 372 that may be used to convert in-phase (I) and quadrature (Q) samples into amplitude and phase samples of a polar coordinate system. The amplitude and phase samples may then be provided to a Cordic freeze sequencer 373 that may be used to freeze and unfreeze the operation of the Cordic data unit 372. A multiplier 374 may be used to scale the amplitude samples with an open loop power control scale factor, ramp_fbk_gain.

After being subtracted from the delayed version of the ramp input provided by the feedback sequencer unit 365 and producing the error signal, a filter 356 may be used to optionally filter the error signal. The filter may be a low pass filter. The filter 356 may help improve the settling behavior of the feedback loop by reducing the error signal's bandwidth.

In a special case with low signal power levels, for example, in case of EDGE modulation less than 5 dBm in Low band (LB; GSM channel frequencies<1 GHz) or less than 0 dBm in High Band (HB; GSM channel frequencies>1 GHz), the detector 330 may not be as useful. This may be due to the power detection capabilities of the detector 330. In such a situation, the feedforward portion 301 may be used for open loop power control of the output power of the PPA 320 and/or the PA 325.

The operation of the power control hardware/software/firmware in the power transceiver 300 may be controlled by the script processor 125 or possibly the digital baseband processor 120. The script processor 125 may be able to dynamically change the performance characteristics of the adder 375, as well as operating parameters of the APC controller 355, and so forth, to achieve uniform (or relatively uniform) power control performance across voltage and/or temperature variations. The script processor 125 may utilize voltage and/or temperature variation compensation algorithms to make adjustments to the operating parameters, for example. This may allow for improved performance across variations in battery voltage, temperature, output load, and so forth.

Figure 5A:
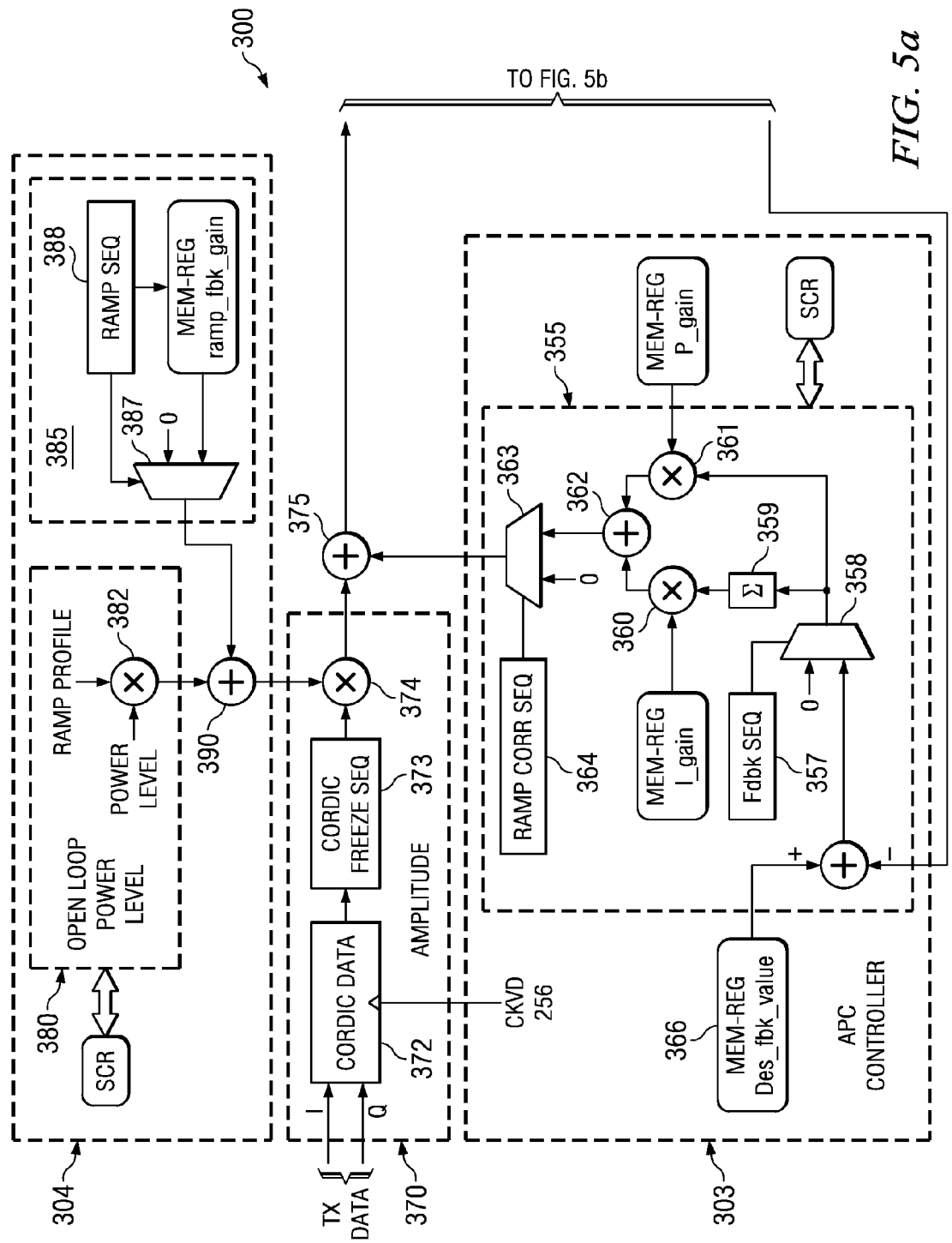
FIG. 5a is a diagram of a portion of power control hardware/software/firmware in a polar transceiver having a filter in a feedback path and simplified error signal computation.
Figure 5B:
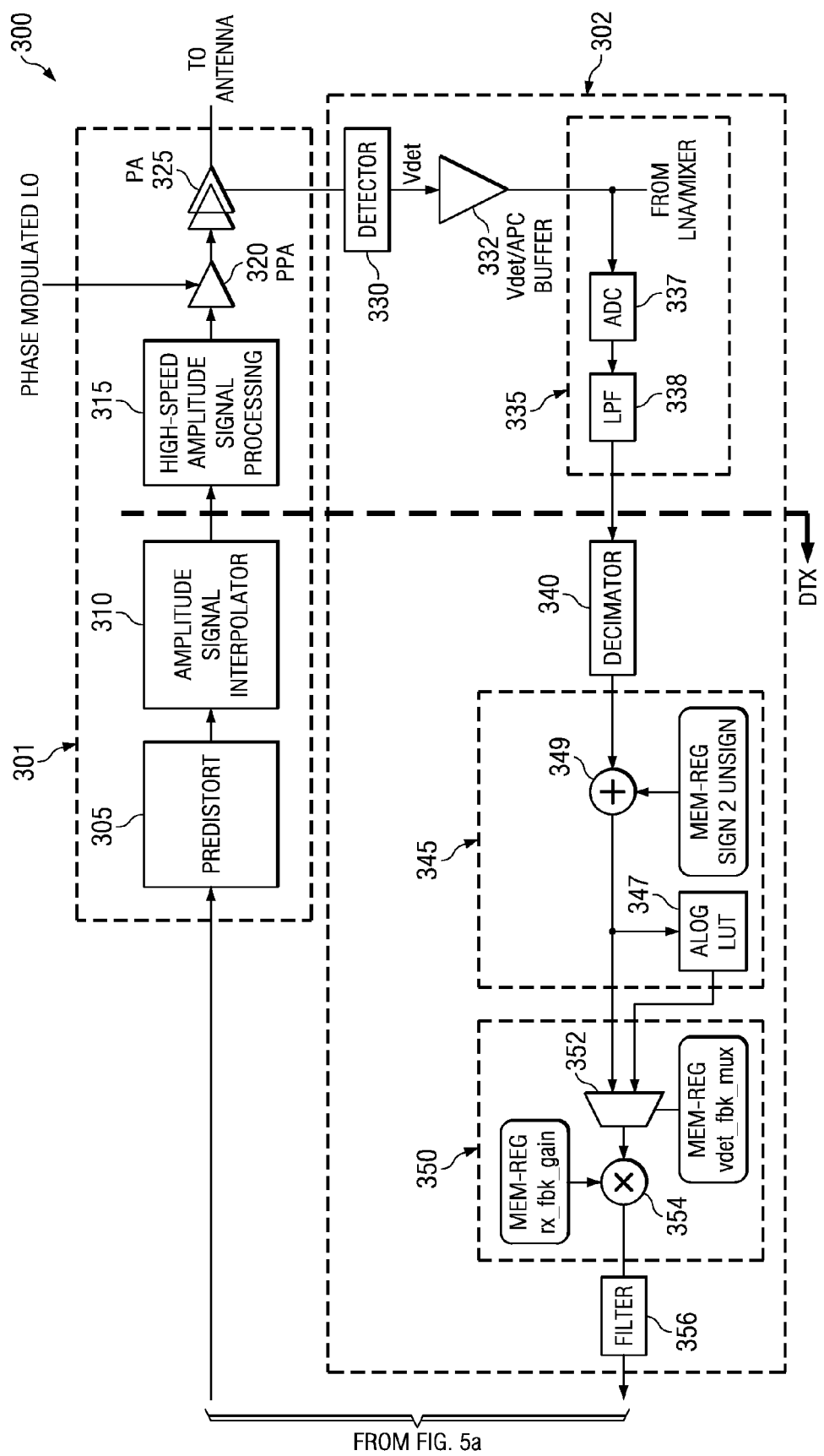
FIG. 5b is a diagram of a portion of power control hardware/software/firmware in a polar transceiver having a filter in a feedback path and simplified error signal computation.

FIGS. 5a and 5b illustrate a detailed view of power control hardware/software/firmware in a polar transceiver 300. As shown in FIG. 5a, the filter 356 may have been moved from inside the APC controller 355, where it was coupled to the multiplexer 358, to outside the APC controller 355, where it may be coupled to the output of the signal gain unit 350. Moving the filter 356 outside of the APC controller 355 effectively places the filter 356 into the feedback portion 302. Moving the filter 356 so that it may be coupled to the output of the signal gain unit 350 may enable a filtering of either the linearized digitized signal or the non-linearized digitized signal. The filtering may provide an averaging of the digitized signal, which may be helpful in more accurately providing a power level of a digitized signal that may be modulated, such as transmissions in WCDMA compliant wireless communications devices. For example, without the averaging performed by the filter 356, the power level of a digitized signal from a WCDMA transmission may continually vary over time. With filtering, the digitized signal may continue to vary, but generally, to a smaller degree. The accurate estimation of the feedback signal average depends on the harmonic content of noise in the raw Vdet feedback signal. If adequately designed, low-pass filtering in the feedback path may achieve good tracking of the average power level at the output of the PA.

Figure 5D:
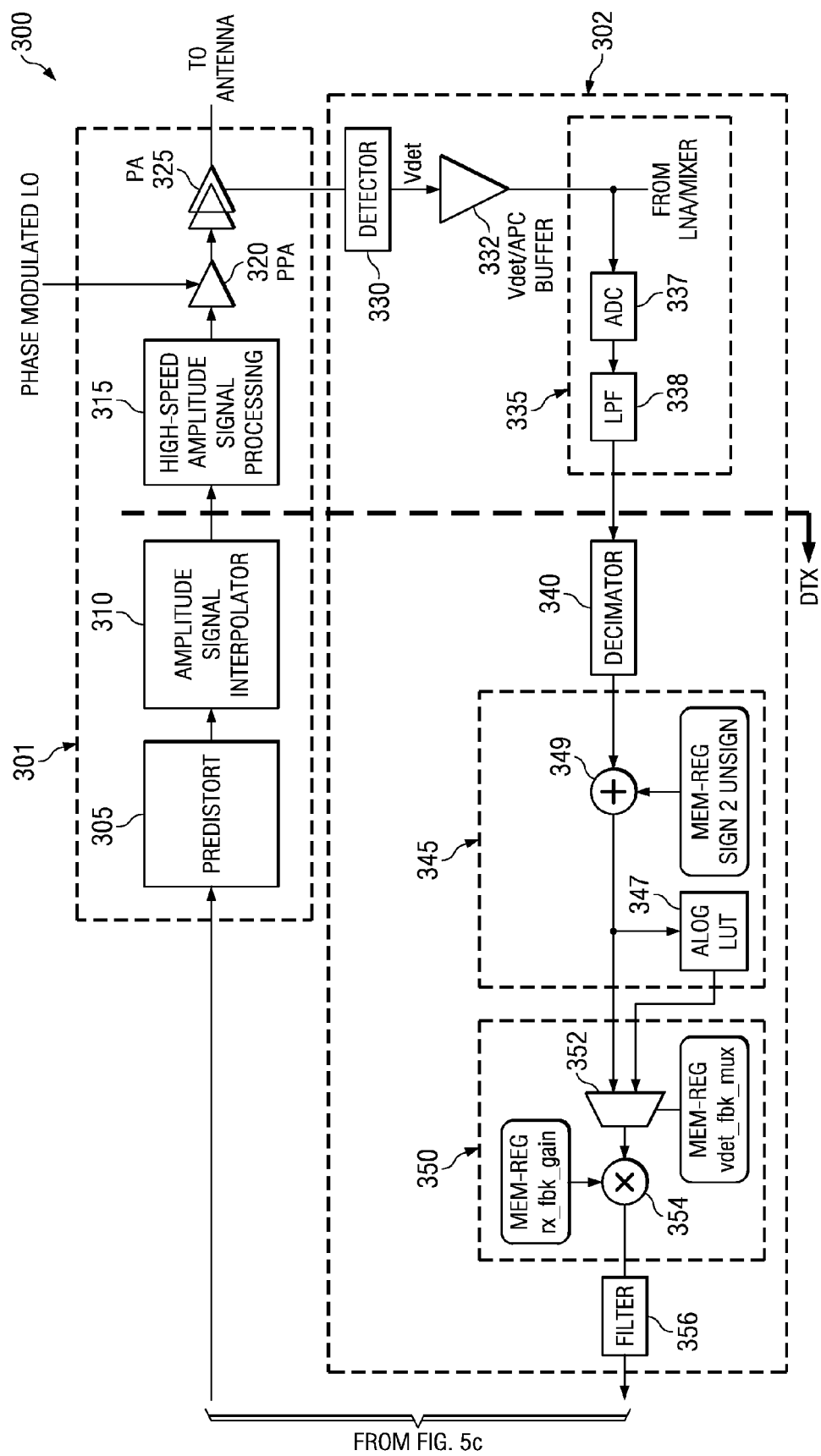
FIG. 5d is a diagram of a portion of power control hardware/software/firmware in a polar transceiver having a filter in a feedback path.

Moving the filter 356 to outside of the APC controller 355 and into the feedback portion 302 may allow for a simplification of the feedback sequencer unit 365. The feedback sequencer unit 365, which may have been used to provide a delayed version of the ramp input, may be replaced with a memory value "Des_feb_value" 366. The memory value 366 may be a desired output power or proportional to a desired output power. A difference between the memory value 366 and the output of the filter 356 may be used to generate the error signal used in the APC controller 355. FIGS. 5c and 5d illustrate a detailed view of power control hardware/software/firmware in a polar transceiver 300, wherein the feedback sequencer unit 365 has been maintained.

Turning back to FIGS. 3a and 3b, a feedback sequencer 357 may control the propagation of the error signal by controlling a multiplexer 358. After the optional filtering and if the feedback sequencer 357 allows the error signal to propagate, the error signal may be provided to a proportional integral (PI) control loop. The integral portion of the PI control loop computes an adjustment to the output power level based on a sum of recent error signals and comprises an accumulator 359 coupled to an output of the multiplexer 358. After integration, the integrated error signal may be scaled (multiplied by multiplier 360) by an integral scale factor, I_gain. In addition to integration and scaling, the error signal may simply be scaled (multiplied by multiplier 361) by a proportional scale factor, P_gain. The scaling by the multiplier 361 makes up the proportional portion of the PI control loop and computes an adjustment to the output power level based on the error signal.

After initial calibration, the proportional scale factor (P_gain) may be disabled. Furthermore, after completing other calibration operations, the integral scale factor (I_gain) may be adjusted to achieve a final steady state power error, which preferably is approximately 3 to 5 dB below maximum output power level. This may help to achieve good settling performance for a wide range of output power levels. Once good integral gain is achieved, the proportional scale factor (P_gain) may be enabled to improve settling time. The integral scale factor (I_gain) may be applied to an accumulated error and is typically smaller in value than the proportional scale factor (I_gain). A normal ratio between the proportional scale factor (P_gain) to the integral scale factor (I_gain) may vary between 16 to 64:1, with a nominal ratio of 32:1.

An adder 362 combines the integral and the proportional portions of the PI control loop and a multiplexer 363 coupled to a ramp correlation sequencer 364 controls the propagation of the output of the PI control loop. If permitted to propagate, the output of the PI control loop may be combined with the output of the Cordic unit 370 to produce a new output power level.

Although shown to implement a PI control loop, the APC controller 355 may also use other types of control loops. For example, the APC controller 355 may implement a PID control loop, wherein D represents derivative. Additionally, the APC controller 355 may implement a P, I, D, ID, PD control loop. In general, the APC controller 355 may implement any form of regulated control loop algorithm.

The APC controller 355 may be used for closed loop power control when there is a need to rapidly and accurately change the output power level of the polar transceiver 300, such as when ramping to a desired output power level. However, once the output power level has reached or almost reached the desired output power level, then the output power level of the polar transceiver 300 may not need to change as rapidly. Furthermore, once the polar transceiver 300 has reached the desired output power level it may be unlikely for the output power level to drift significantly away from the desired output power level with such rapidity that the settling speed of the APC controller 355 may be needed to bring the output power level back to the desired output power level.

Therefore some or all of the hardware associated with the operation of the APC controller 355, such as the detector 330, the buffer 332, the digitizer 335, the decimator 340, the non-linear corrector 345, the signal gain unit 350, the APC controller 355, and so forth, may be powered down to reduce power consumption by a significant amount. The reduction in power consumption may extend battery life in wireless communications devices. Therefore, there may be a need for a low-power technique for maintaining the desired output power level once the output power level has attained the desired power level. The lower output power level control may permit the use of an open loop power level control, which may tend to have lower power consumption.

The ramp path power control portion 304 includes an open loop power level control unit 380 and a ramp sequencer unit 385. The open loop power level control unit 380 may be used to maintaining the output power level at the desired output power level once the output power level has attained the desired power level. The open loop power control unit 380 includes a multiplier 382 that may be used to scale a power level with a ramp profile. The result of the scaling may be added to an output of the ramp sequencer unit 385, which may produce a signal based on the type of power control that is in use (either close loop or open loop). If ramp path power control is in use, then a multiplexer 387, based on a value produced by a ramp sequencer 388, may select to send zeroes to an adder 390. If closed loop power control is in use, then the multiplexer 387 may select to send a gain value, ramp_fbk_gain, to the adder 390. The adder 390 may then combine the outputs of the open loop power control unit 380 and the ramp sequencer unit 385 to produce an open loop error signal. The open loop error signal may then be multiplied (multiplier 374) with the ramp input (output of the Cordic freeze sequencer 373) to affect adjustments to the ramp input.

The multiplicative nature of the open loop error signal (use by multiplier 374) used in ramp path power control may provide a scaling function that may be independent of the actual value of the ramp input. This may enable a finer control in the adjustments of the output power level. The additive nature of the closed loop error signal used in the closed loop power control (use by adder 375) may provide a scaling function that may be dependent upon the actual value of the ramp input. This, therefore, may enable a more rapid adjustment of the output power level. The computation of a multiplicative correction term used in the open loop error signal may be akin to adaptively estimating a linear gain correction for the predistortion unit 305. This linear gain may also be used by a predistortion update/tracking/compensation algorithm in the predistortion unit 305.

Figure 6A:
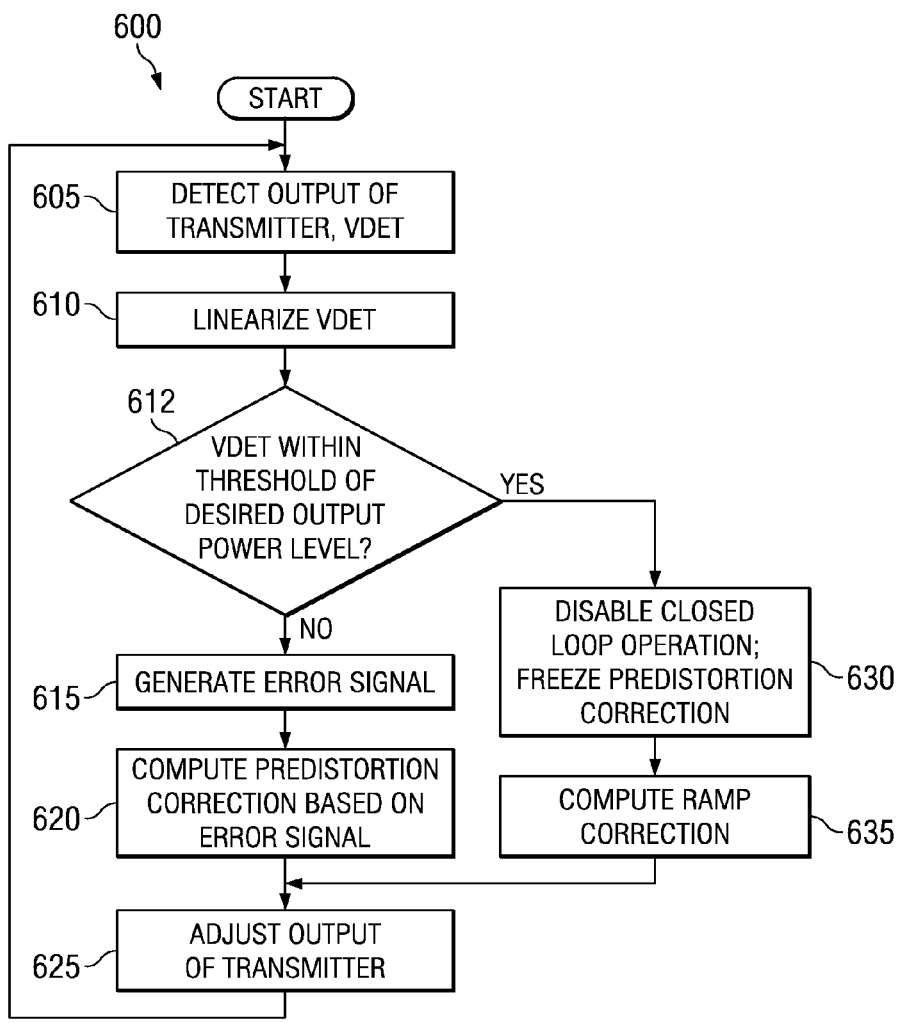
FIG. 6a is a diagram of a sequence of events in adjusting a transceiver's output power level.

FIG. 6a illustrates a sequence of events 600 in the adjusting of a transceiver's output power level. The adjusting of the output power level of a transceiver, such as the polar transceiver 300, may occur continuously while the polar transceiver 300 is powered on. Alternatively, the adjusting may occur prior to the polar transceiver 300 initiating a transmission. The adjustment may continue until the polar transceiver 300 is powered off, placed in a sleep or suspend mode, or no longer transmitting.

The adjustment of the output power level may begin with a detection of the output of a transmitter, such as a polar transmitter in the polar transceiver 300 (block 605). The detection of the output may occur in a detector located in or near a power amplifier of the polar transceiver 300. For example, the detector 330 may detect the output of the PA 325 and produce a voltage signal, Vdet, proportional to the output power of the PA 325. The voltage signal Vdet may then be digitized and linearized (block 610). The non-linearity that may be present in the digitized voltage signal Vdet may be due to a number of factors, including non-linearities in the detector 330, the buffer 332, the ADC 337, comparators, and so forth.

Digitization may take place in an analog-to-digital converter. The analog-to-digital converter may be one dedicated to the digitization of the voltage signal Vdet or it may be an analog-to-digital converter normally used for other purposes, such as an analog-to-digital converter in a receiver typically used in digitizing signals received in an over-the-air transmission. The analog-to-digital converter in the receiver may be used to digitize the voltage signal Vdet while the receiver is not being used or is otherwise idle.

Linearization may be necessary to correct for any non-linear behavior inherent in the detector 330. For example, linearization may be needed to correct for a logarithmic behavior of a logarithmic power detector. Furthermore, the linearization may also used to compensate for undesired behavior in other components of the polar transceiver 300, such as the non-linearities in the output signal introduced by the PPA 320 or the PA 325. In addition to linearization, the digitized version of the voltage signal may also be converted into an unsigned value if an analog-to-digital converter used in the digitization produced signed values.

The voltage signal Vdet may then be compared to a desired output power level or a value related to the desired output power level (block 612). If the voltage signal Vdet is not within a threshold of the desired output power level (block 612), then the closed loop output power level control should continue. The linearized and converted digitized version of the voltage signal, which may be a representation of the output power of the polar transceiver 300, may then be used to generate an error signal (block 615). The error signal may be a difference between the linearized and converted digitized version of the voltage signal and a signal provided to the PA 325 that resulted in the linearized and converted digitized version of the voltage signal. The error signal may be generated by subtracting the linearized and converted digitized version of the voltage signal from the signal provided to the PA 325. The linearized and converted digitized version of the voltage signal may be scaled prior to the subtraction to compensate for a signal gain provided by the PA 325.

The error signal may then be used to compute a predistort correction term, $C_{P,APC}$ (block 620). The predistort correction term $C_{P,APC}$ may be expressed as $C=\rho_{predistort}-R\cdot\rho_{Cordic}$, where $\rho_{predistort}$ is an amplitude control word input to the predistort unit 305, $\rho_{Cordic}$ is an amplitude control word output from the Cordic data unit 372, and R is a digital value corresponding to a ramp value. The predistort correction term $C_{P,APC}$ may be combined with the signal provided to the PA 325 to increase or decrease the signal provided to the PA 325 so that the output of the polar transceiver 300 has a power level that is about equal to a desired output power level. Alternatively, the power level of the output of the polar transceiver 300 approaches the desired output power level if a difference between the power level of the output of the polar transceiver 300 and the desired output power level exceeds the PA's ability to change within an allotted time period.

Figure 6B:
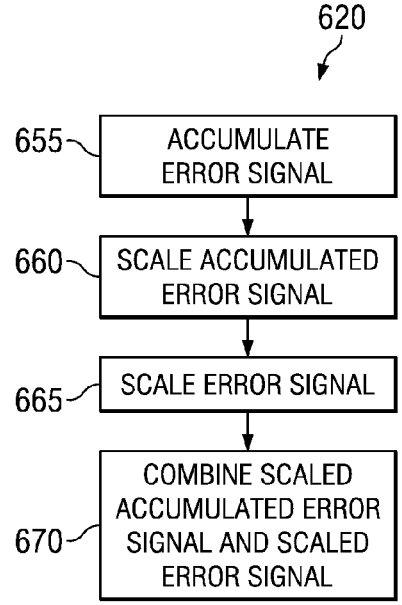
FIG. 6b is a diagram of a sequence of events in computing a predistort correction term.

FIG. 6b illustrates a detailed view of the computing of the predistort correction term C.sub.P,APC (block 620). The computing of the predistort correction term C.sub.P,APC may depend on the type of the control loop. For example, a proportional integral (PI) control loop may include the use of an accumulator, while a proportional control loop may not. For a PI control loop as shown in FIGS. 3a and 3b, the computing of the predistort correction term C.sub.P,APC may include accumulating the error signal (block 655) and then scaling it with an integral scaling factor (block 660). Furthermore, the error signal may be scaled with a proportional scaling factor (block 665). The scaled, accumulated error signal and the scaled error signal may then be combined to produce the predistort correction term C.sub.P,APC (block 670).

Turning back now to FIG. 6a, after computing the predistort correction term $C_{P,APC}$, the predistort correction term $C_{P,APC}$ may be used to adjust the output of the transmitter of the polar transceiver 300 (block 625). The predistort correction term $C_{P,APC}$ may be added to the signal provided to the PA 325, which may result in a change in the output power level of the polar transceiver 300. The sequence of events 600 may then return to block 605 to repeat the adjusting of the polar transceiver's output level. The sequence of events 600 may continue until the polar transceiver 300 is powered down, placed in sleep or suspend mode, or is no longer transmitting.

However, if the voltage signal Vdet is within a threshold of the desired output power level (block 612), then the performance capabilities of the close loop output power level control may no longer be needed and ramp path power control may be initiated. The closed loop output power level control performed by the APC controller 355 may be stopped by disabling the APC controller 355, and freezing a current predistort correction term $C_{P,APC}$ (block 630). With the closed loop power control performed by the APC controller 355 disabled, ramp path power control may be used. Ramp path power control may be a form of open loop power control. Ramp path power control makes use of a correction term in addition to the current predistort correction term $C_{P,APC}$. A correction term for ramp path correction, $C_{R,APC}$, may then be computed (block 635). The correction term for ramp path correction $C_{R,APC}$ may be computed using expression:

$$C_{R,APC} = \frac{C_{P,APC}}{\rho_{Cordic}},$$

where $C_{P,APC}$ is the current correction to a predistortion linear term computed by the APC controller 355, such as computed in block 620, and $\rho_{Cordic}$ is amplitude control word output from the Cordic data unit 372. The adjusting of the output of the polar transceiver 300 may be achieved by multiplying the correction term for ramp path correction $C_{R,APC}$ with output of the Cordic data unit 372. The computation of a multiplicative correction term may be akin to adaptively estimating a linear gain correction for the predistortion unit 305. This linear gain may also be used by a predistortion update/tracking/compensation algorithm in the predistortion unit 305. A common requirement in many 2G/3G communications standards is for a transmission to be preceded by a rapid power ramp up and followed by a rapid ramp down. When not transmitting, a 3G compliant transceiver should not output a signal with significant power level. This may help to keep interference between 3G compliant communications devices to a minimum. However, the rapid power ramp up requirement may be difficult to perform with necessary accuracy.

After computing the multiplicative correction term, the multiplicative correction term may be used to adjust the output of the transmitter of the polar receiver 300 (block 625). It may be preferred that the application of the multiplicative correction term occur in a glitchless or relatively glitchless manner. This may be accomplished by controlling a sampling rate of power level scaling and an update rate of closed loop power control.

Figure 7:
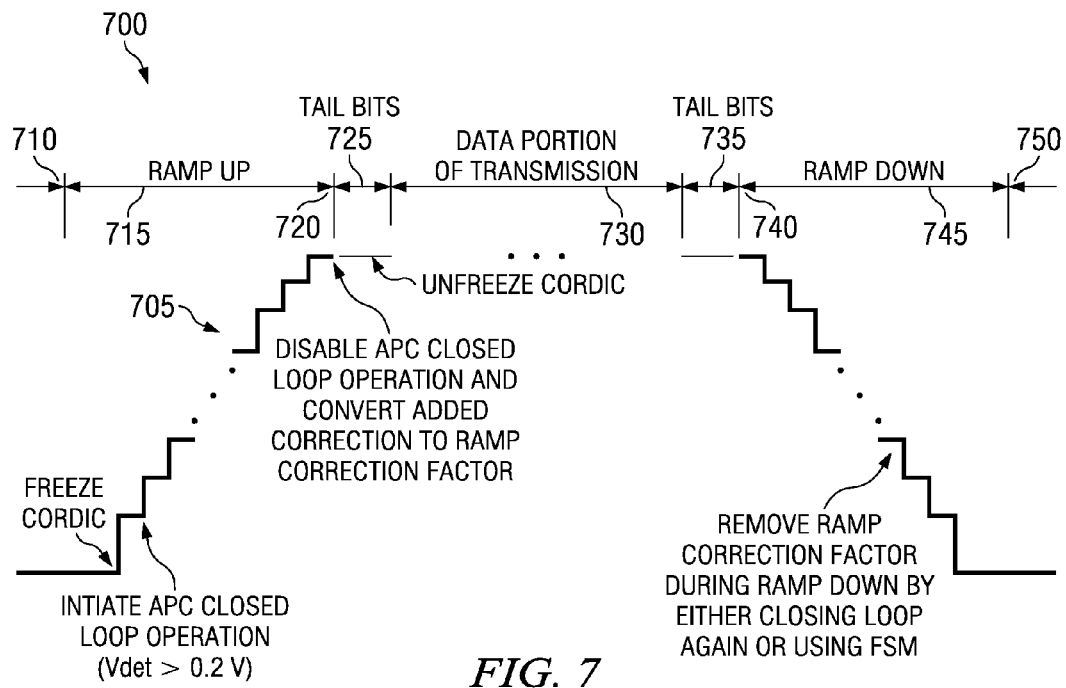
FIG. 7 is a diagram of a timing diagram displaying a typical ramp up, transmit, ramp down sequence in an output signal of a transceiver.

FIG. 7 illustrates a timing diagram 700 displaying a typical ramp up, transmit, ramp down sequence in an output signal 705 of a transceiver, such as the polar transceiver 300, resulting from the polar transceiver 300 making a transmission. Additionally, the diagram shown in FIG. 7 illustrates power control operating mode changes occurring during the transmission. Prior to the transmission (at times prior to marker 710), the output signal 705 may be at a steady-state non-transmission level, which may be at or about zero or some other specified level.

At marker 705, the polar transceiver 300 begins preparation for transmission. The preparation for transmission begins with a ramp up period (interval 715) wherein the output signal increases from the steady-state non-transmission level to a specified power level. For some 2G/3G communications standards, the change in power level may be on the order of 30 to 40 dBs. To help reduce impact on the settling of the APC controller 355, it may be possible to turn off (freeze) the Cordic data unit 372, since ripple that may be present in the output of the Cordic data unit 372 may negatively impact the settling time. Additionally, once the power level begins to ramp up, the closed loop power control provided by the APC controller 355 may be turned on. For example, once the voltage signal Vdet exceeds 0.1 Volts. However, using a low-pass averaging window filter in the feedback path, such as filter 356 in FIGS. 5a, 5b, 5c, and 5d, the closed loop power control provided by the APC controller 355 may be extended to Vdet signal below 0.1V. The filter 356 in this case averages the feedback signal resulting in cancellation of zero-mean additive noise on the Vdet signal.

Preferably, once the power level of the output signal reaches the specified power level at marker 720, the closed loop power control may be disabled by disabling the APC controller 355. Additionally, a current predistort correction term $C_{P,APC}$ may be frozen and ramp path power correction may be enabled. Disabling the APC controller 355 may result in a reduction in power consumption, which may extend battery life. In addition to turning off closed loop power control, may be turned on. Since the power level typically does not change significantly or rapidly during a transmission, the performance of ramp path power control is typically sufficient.

With the closed loop power control disabled and the ramp path power control enabled, the transmission may begin. The transmission may begin with the turning on (un-freezing) of the Cordic data unit 372 and the transmission of header/footer bits, for example, tail bits (shown as interval 725). Following the transmission of header/footer bits, a data portion of the transmission may be made (shown as interval 730). Once the data portion of the transmission has been made, the transmission of final header/footer bits may be made (shown as interval 735). After the transmission of the final header/footer bits, shown at marker 740, the transmission process may complete with a ramp down of the power level of the output signal. The transmission of the header/footer bits may enable a relatively seamless merging of transmissions made during ramping (ramp up and/or ramp down) with the transmission of data. The transmission of the header/footer bits may have a similar symbol pattern as the transmission of the data. This may allow a pulse shaping filter to provide a smooth transition between power control and data transmission.

Figure 8A:
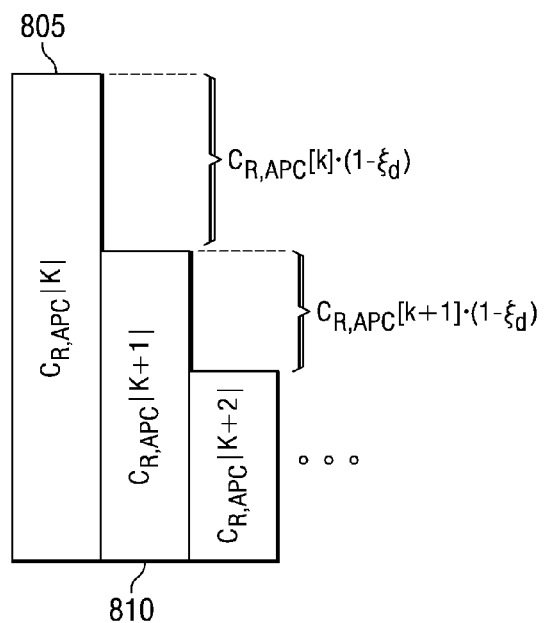
FIG. 8a is a diagram of correction terms for ramp path correction with an exponentially decaying value.

The ramp down of the power level may occur during an interval 745 and may be achieved by continuing to use the open loop power control, enabling the closed loop power control, or using a finite state machine to control the power down. The use of open loop power control for ramp down may result in power savings and may be performed without using closed loop power control. The power ramp down may continue until the power level reaches the steady-state non-transmission level, shown at marker 750. For example, using ramp path power control, the ramp down may be accomplished by sequentially multiplying the correction term for ramp path correction $C_{R,APC}$ with an exponentially decaying value. Using an exponential decaying value, the correction term for ramp path correction may be expressed as:

$$C_{R,APC}[k+1] = C_{R,APC}[k] \cdot \xi_d,$$

where $\xi_d$ is an exponential decay factor, and $C_{R,APC}[k]$ is the k-th ramp path correction term. FIG. 8a illustrates a sequence of ramp path corrections $C_{R,APC}$. A k-th ramp path correction $C_{R,APC}[k]$ 805 may be $C_{R,APC}[k]\cdot(1-\xi_d)$ greater in value than a (k+1)-th ramp path correction $C_{R,APC}[k+1]$ 810, with the amount of change in the ramp path corrections decreasing with increasing ramp path correction index.

Figure 8B:
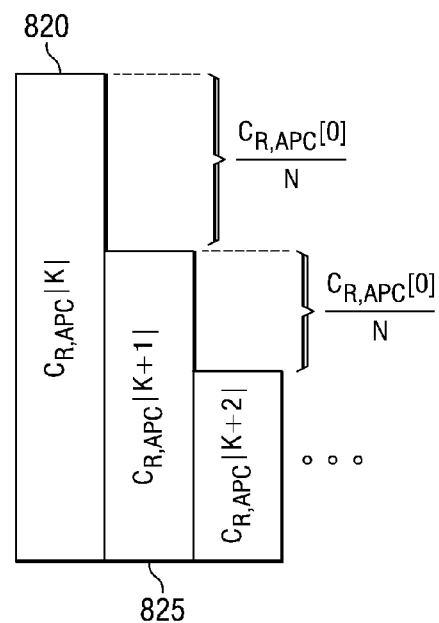
FIG. 8b is a diagram of correction terms for ramp path correction with a subtractive decay value.

Alternatively, the ramp down may be accomplished by subtracting the correction term for ramp path correction $C_{R,APC}$ with a subtractive value. Using a subtractive decay value, the correction term for ramp path correction may be expressed as:

$$C_{R,APC}[k+1] = C_{R,APC}[k] - \frac{C_{R,APC}[0]}{N},$$

where $C_{R,APC}[0]$ is a final settle correction term for ramp path correction, $C_{R,APC}[k]$ is the k-th ramp path correction term, and N is a number of correction terms. FIG. 8b illustrates a sequence of ramp path corrections $C_{R,APC}$. A k-th ramp path correction $C_{R,APC}[k]$ 820 may be $$\frac{C_{R,APC}[0]}{N}$$

greater in value than a (k+1)-th ramp path correction $C_{R,APC}[k+1]$ 825, with the amount of change in the ramp path corrections remaining constant with increasing ramp path correction index.

Figures 8C, 9:
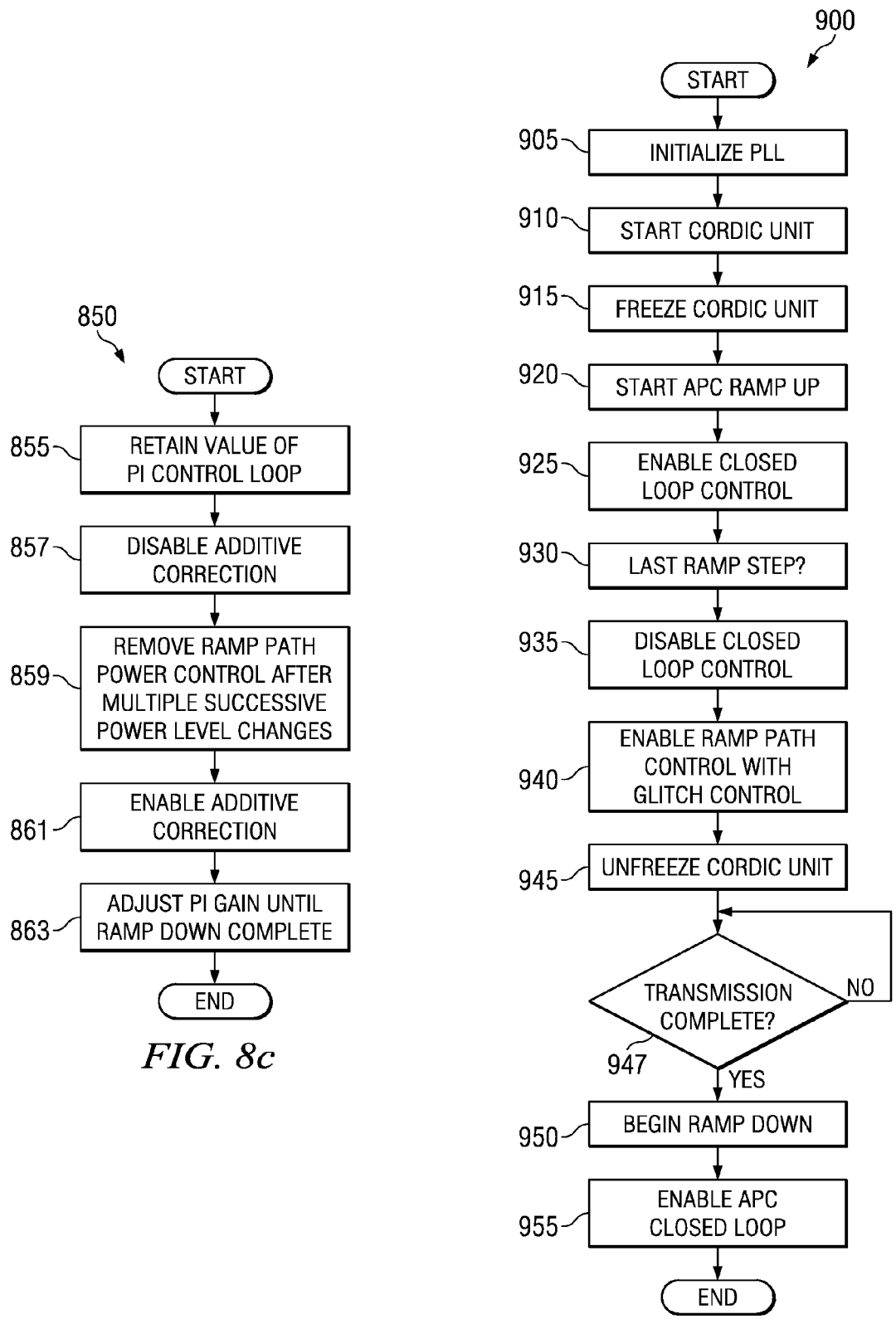
FIG. 8c is a sequence of events in power ramp down with closed loop power control.
FIG. 9 is a diagram of a sequence of events in power control of an output signal during a transmission.

In addition to using ramp path power control, the power ramp down may be achieved using closed loop power control. FIG. 8c illustrates a sequence of events 850 for use in power ramp down with closed loop power control. Power ramp down using closed loop power control may follow the following sequence of events: 1) Retain value in an accumulator of PI control loop, such as the accumulator 359, and Disable APC controller 355 (block 855); 2) Disable additive correction from APC controller 355, such as by disabling the adder 375 (block 857); 3) After one or two successive power level changes, remove ramp path power control (block 859); 4) Enable APC controller 355 and enable additive correction from APC controller 355 with glitch control (block 861); and 5) Adjust proportional and integral loop gains as needed, the power ramp down may be complete when the power level of the output signal returns to the steady-state non-transmission level, shown at marker 645 (block 863).

FIG. 9 illustrates a sequence of events 900 for use in power control of an output signal during a transmission. As discussed previously, a transmission may typically be partitioned into three stages. A first stage being a power ramp up wherein a transmitter increases its output power level from a steady-state non-transmission power level to a specified power level, a second stage being the actual transmission, and a third stage being a power ramp down wherein the transmitter decreases its output power level from the specified power level down to the steady-state non-transmission power level. The amount of change in the output power level between the steady-state non-transmission power level and the specified power level may depend on the communications standard, however, the change may range from a few dBs to a range of 30 to 40 or more dBs.

The power control may begin in the power ramp up stage with by initializing a clock reference source, such as a phase-locked loop or an all-digital phase-locked loop (ADPLL), as well as calibrating transmission circuitry (block 905). After the clock reference source has settled and stabilized, the Cordic data unit 372 may be started (block 910). Since data may not be transmitted, the Cordic data unit 372 may be configured to generate a known sequence, such as a sequence of all one's, zero's, or some other sequence. Preferably, the Cordic data unit 372 generates a sequence of one's with varying phase angles. Conceptually, the Cordic data unit 372 generates the sequence of one's by rotating around a unit circle.

The output of the Cordic data unit 372 may then be frozen (block 915). The freezing of the output of the Cordic data unit 372 may be to reduce the impact of any ripple in the output of the Cordic data unit 372 on the settling of the APC controller 355. With the output of the Cordic data unit 372 frozen at a known value, for example, a one, the output power of the transmitter may begin to increase. Once the output power of the transmitter reaches a specified value, or a detected signal corresponding to the output power of the transmitter, such as the voltage signal Vdet, the power ramp up may begin by starting the closed loop power control performed by the APC controller 355 (block 920) and enabling close loop power control (block 925). For example, the closed loop power control may be started once the voltage signal Vdet exceeds 0.2 Volts. Alternatively, the closed loop power control may be started when a digitized signal corresponding to the voltage signal Vdet exceeds a specified binary value.

The closed loop power control may be used until the power ramp up is complete or is about to be complete. With the power ramp up complete or about complete, the performance of the close loop power control may no longer be required. Therefore, the circuitry used in the closed loop power control may be shut down or suspended to help reduce power consumption. A check may be made to determine if the power ramp up is complete or close to being complete (block 930). If the power ramp up is complete or close to being complete, the closed loop power control may be stopped (block 935) and ramp path power control may be started (block 940).

The starting of the ramp path power control, if done improperly, may result in a glitch in the output signal. Ideally, for transmission standards such as 2G, when the Cordic data unit 372 is generating a sequence of one's with varying phase angle, the magnitude also does not remain at constant one, but rather may show cyclic variation due to the use of limited resolution for the cordic amplitude output. The cyclic variation in the magnitude may have the appearance of ripple about the magnitude one. Therefore, if there is a time difference between when stopping of the closed loop power control and the starting of the ramp path power control, the magnitude of the one being generated by the Cordic data unit 372 may differ. Therefore, the timing of the stopping of the closed loop power control and the starting of the ramp path power control may be set so that a difference in the time of the stopping of the closed loop power control and the starting of the ramp path power control may be substantially equal to an integer multiple of a symbol period, where a symbol period is equal to the time between Cordic values having identical phase angles. The symbol period may also be referred to as a data transmission symbol period. Hence, with the time difference being substantially equal to an integer multiple of the symbol period (or data transmission symbol period), the Cordic data unit 372 may be producing Cordic values with substantially identical magnitude and phase values. This may then minimize glitches that may result from the switch between closed loop power control and ramp path power control.

Once the power ramp up stage is complete, the transmitter may maintain a freeze on the Cordic data unit 372 until it is ready to make the transmission, when it may unfreeze the Cordic data unit 372 to begin the transmission with header/footer bits, followed by data making up the transmission, and additional header/footer bits, depending on the transmission's format (block 945). With the Cordic data unit 372 unfrozen and the transmitter transmitting, the power control of the output signal may continue with a check to determine if the transmission made by the transmitter is complete (block 947). If the transmission is not complete, the power control of the output signal may continue and the transmitter may continue to transmit. If the transmission is complete, then the power ramp down stage may begin (block 950). Power ramp down may occur in several different ways. A rapid power ramp down may be achieved by turning off the open loop power control and turning on the closed loop power control (block 955). Alternatively, a more gradual power ramp down may be achieved through the use of the open loop power control or a finite state machine.

FIG. 10 illustrates a sequence of events 1000 for use in power control of an output signal during a transmission. In applications wherein there may not be a need for rapid changes in output power level or if the changes in the output power level are relatively small or if the communication standard mandates continuous transmission, then it may not be necessary to freeze and unfreeze the Cordic data unit 372. For example, in a WCDMA compliant communications device, necessary output power level changes may usually not be large enough plus the standard requires continuous modulation even during a power level change. Thus in a digital polar transmitter used for WCDMA, there is no need for freezing and unfreezing of the Cording data unit 372.

The power control may begin in the power ramp up stage with by initializing a clock reference source, such as a phase-locked loop or an all-digital phase-locked loop (ADPLL), as well as calibrating transmission circuitry (block 1005). After the clock reference source has settled and stabilized, the Cordic data unit 372 may be started (block 1010). Since data may not be transmitted, the Cordic data unit 372 may be configured to generate a known sequence, such as a sequence of all one's, zero's, or some other sequence. The output power of the transmitter may then be allowed to rise. Once the output power of the transmitter reaches a specified value, or a detected signal corresponding to the output power of the transmitter, such as the voltage signal Vdet, the power ramp up may begin by starting the closed loop power control performed by the APC controller 355 (block 1020) and enabling close loop power control (block 1025).

The closed loop power control may be used until the power ramp up is complete or is about to be complete. With the power ramp up complete or about complete, the performance of the close loop power control may no longer be required. Therefore, the circuitry used in the closed loop power control may be shut down or suspended to help reduce power consumption. A check may be made to determine if the power ramp up is complete or close to being complete (block 1030). If the power ramp up is complete or close to being complete, the closed loop power control may be stopped (block 1035) and ramp path power control may be started (block 1040).

The PA, such as PA 325, may require that the PA bias voltage, PA gain mode, as well as other controls, to be manipulated using dedicated logical control lines or a shared control mechanism, such as a serial bus, for example. These controls may be among the auxiliary functions performed by the power control hardware/software/firmware. The PA bias voltage may be a function of the output power level of the PA 325 in which the case the power control hardware/software/firmware may also use either a look-up table, functional approximation and/or a limited set of control points as specified by a digital baseband. The analog bias control may be applied using a digital-to-analog converter (DAC) followed by an analog buffer/filter.

The PA 325 may also contain an integrated switched mode power supply (SMPS), which may require a separate control through a dedicated analog control line plus dedicated logical lines or a shared control mechanism, such as a serial bus. The SMPS control voltage may be a function of the output power level of the PA 325 in which the case the power control hardware/software/firmware may also use either a look-up table, functional approximation and or a limited set of control points as specified by the digital baseband. The analog SMPS control may be applied using a digital-to-analog converter (DAC) followed by an analog buffer/filter.

Since the Cordic data unit 372 has remained on, there may not be a need to perform glitch control in the output signal once the ramp path control is enabled and the transmission by the transmitter begins (block 1040). The transmission may begin with the transmission of header/footer bits, followed by data making up the transmission, and additional header/footer bits, depending on the transmission's format. The power control of the output signal may continue with a check to determine if the transmission made by the transmitter is complete (block 1047). If the transmission is not complete, the power control of the output signal may continue and the transmitter may continue to transmit. If the transmission is complete, then the power ramp down stage may begin (block 1050) with a rapid power ramp down enabled by turning off the open loop power control and turning on the closed loop power control (block 1055).

FIG. 11 illustrates a sequence of events 1100 for use in self-calibrating a digital polar transmitter 300. Once the output power level of a transmitter, such as the digital polar transmitter 300, has settled to a desired output power level, the output power level of the transmitter may typically remain at the desired output power level until instructed to change. Using the power control hardware/software/firmware as shown in FIGS. 3, 5*a*, and 5*b*, a change in desired output power level may result in a use of the closed loop power control and the ramp path power control to properly effect the necessary change in the output power of the transmitter. However, the use of both closed loop power control and ramp path power control may be unnecessarily complex and may consume more power than needed.

The sequence of events 1100 illustrates a self-calibrating operating mode for the digital polar transmitter 300 for responding to changes in desired output power level once the digital polar transmitter 300 has settled to a desired output power level. The self-calibrating operating mode may begin with a detection of a change in desired output power level (block 1105). If there is no change in the desired output power level, the self-calibrating operating mode may return to a waiting state. If there is a change in the desired output power level, then the self-calibrating operating mode may compute an average of a feedback signal (block 1110). The feedback signal may be related to a detected output power level of the digital polar transmitter 300, such as detected by the detector 330. The averaging of the feedback signal may be achieved by enabling a filter, such as the filter 356, located in the feedback portion 302 of the digital polar transmitter 300.

The averaged value of the feedback signal may then be provided to the open loop power level control unit 380, where it may be compared with the desired output power level that may be used to control the operating of the open loop power level control unit 380 (block 1115). Then, based on the result of the comparison, the output power level of the digital polar transmitter 300 may be adjusted (block 1120). The output power level of the digital polar transmitter 300 may be adjusted using the open loop power level control unit 380 by computing a correction term for ramp path correction $C_{R,APC}$ based on the comparison between the averaged value of the feedback signal and the desired output power level. The open loop power level control may making adjustments by computing correction terms for ramp path correction $C_{R,APC}$ until the comparison (block 1115) between the averaged value of the feedback signal and the desired output power level results in a difference that is less than a specified value.

In the self-compensation operating mode, the averaged value of the feedback signal may also be used to adaptively change the values of the rx_fbk_gain (used by multiplier 354) and the DC offset addition (used by adder 349). This allows for precise closed loop power control to be extended across wider operational conditions in the TX such as temperature change, operational frequency and especially any load impedance variations at the PA output. The filter 356 may also be used in the adaptive changing of the values of rx_fbx_gain and the DC offset addition, with enhanced accuracy afforded by the filtered values.

Figure 12B:
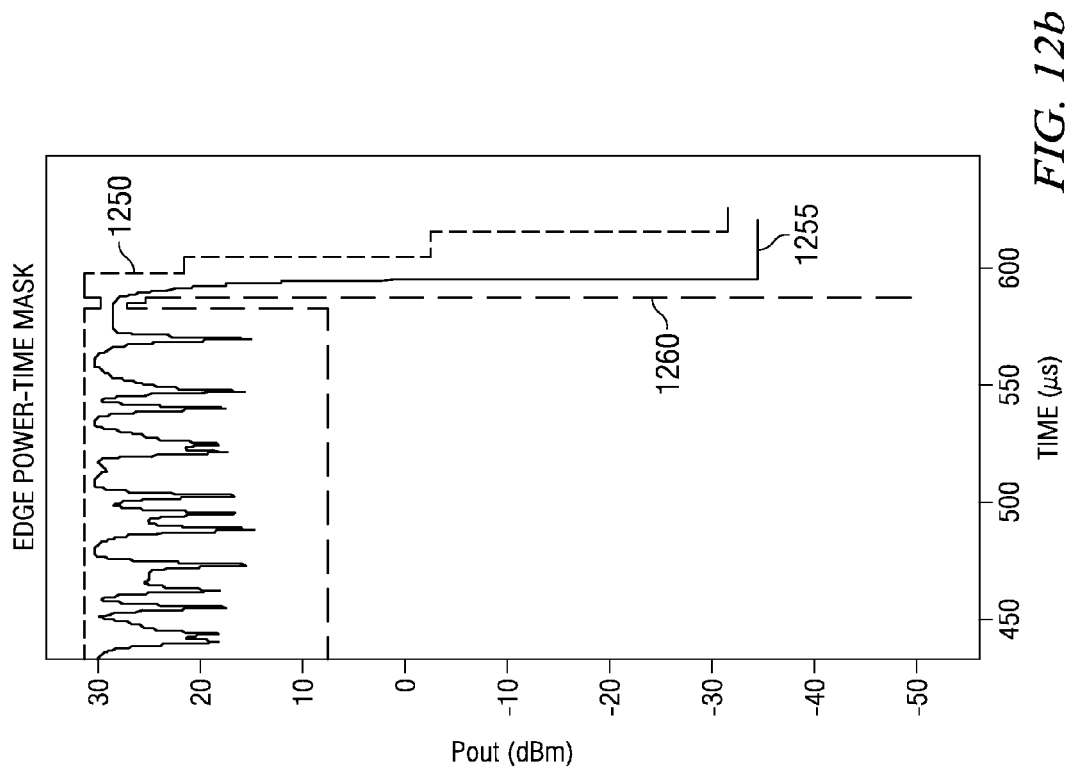
FIGS. 12a and 12b are diagrams of data plots of closed loop power control power-time masks for EDGE compliant communications devices.
Figure 12A:
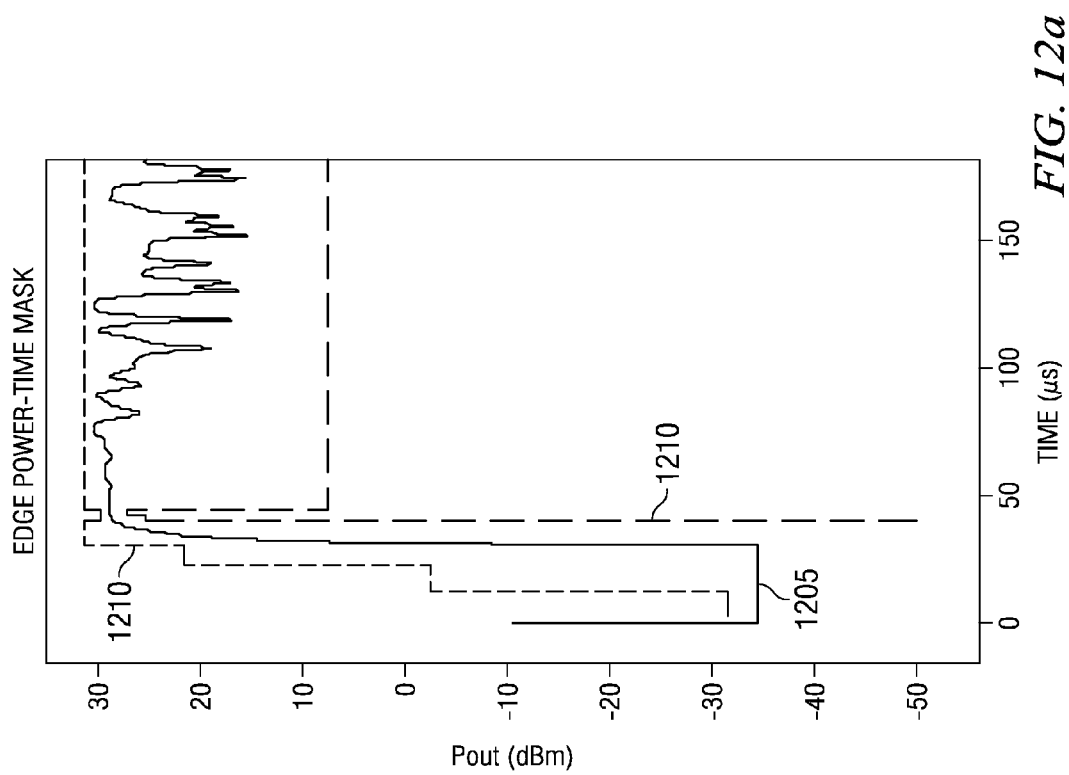

FIGS. 12*a* and 12*b* illustrate data plots of closed loop power control power-time masks for EDGE compliant communications devices during ramp up (FIG. 12*a*) and ramp down (FIG. 12*b*). FIG. 12*a* illustrates a power level curve 1205 and a power mask 1210 for ramp up and FIG. 12*b* illustrates a power level curve 1255 and a power mask 1260 for ramp down. The power level curve 1205 and the power level curve 1255 illustrate exemplary output power level of a communications device containing a polar transceiver, such as the polar transceiver 300. The power mask 1210 and power mask 1220 may be as specified by the EDGE communications standard for power level ramp up and ramp down.

The script processor 125 or the digital baseband processor 120 may also modify rx_fbk_gain (used by multiplier 354) and the DC offset addition (used by adder 349) using power control supervisory algorithms implemented in software or firmware. This may be done to account for Vdet variations in the PA 325 (obtained by PA characterization data) and/or known (or characterized) changes in the feedback portion 302 across process, voltage, temperature, frequency and load impedance. In this scheme the power control hardware/software/firmware may benefit from additional information available at the higher levels of an electronic device containing the digital polar transceiver 300 such as the temperature of the PA 325, feedback from on-chip temperature, frequency, output power level and/or process sensing mechanism, for example. This allows for an improvement of the overall system performance across a wider range of operational conditions in the transmitter. Such a mechanism may become part of the regular temporal phone parameter updates.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A power control loop comprising:
a feed forward unit coupled to a data source, the feed forward unit configured to process a signal for transmission;
a feedback unit coupled to the feed forward unit, the feedback unit configured to generate a feedback signal representative of an output power level of the signal processed for transmission by the feed forward unit; and
a closed loop power control unit coupled to the feedback unit and to the feed forward unit, the closed loop power control unit configured to generate an additive correction signal based on an error signal computed from the feedback signal and data provided by the data source or software instructions, wherein the additive correction signal is computed using a regulated control algorithm, wherein the additive correction signal is added to the data.

2. The power control loop of claim 1, further comprising a ramp path power control unit coupled to the data source, the ramp path power control unit configured to generate a multiplicative correction signal based on the additive correction signal and data provided by the data source, wherein the multiplicative correction signal is used to scale the data.

3. The power control loop of claim 1, wherein the feedback unit comprises: a detector coupled to the feed forward unit, the detector to generate the feedback signal representative of the signal transmitted by the feed forward unit; and a digitizer coupled to the detector, the digitizer configured to digitize the feedback signal.

4. The power control loop of claim 3, wherein the feedback unit further comprising a linearizer coupled to the digitizer, the linearizer configured to remove non-linearities in the digitized feedback signal.

5. The power control loop of claim 4, wherein the feedback unit further comprises a sign converter coupled between the digitizer and the linearizer, the sign converter to convert a signed value created by the digitizer into an unsigned value.

6. The power control loop of claim 5, wherein the sign converter is further configured to remove a bias present in the digitized feedback signal.

7. The power control loop of claim 1, wherein the feed forward unit comprises a power control slope unit configured to provide a power slope correction for amplifiers contained in the feed forward unit.

8. The power control loop of claim 7, further comprising:
wherein the feed forward unit comprises a predistortion unit configured to provide an adaptive estimation of a linear gain correction for the amplifiers contained in the feed forward unit; and
wherein the power control loop further provides the predistortion unit a corrective signal that performs a corrective adjustment to a slope of the signal processed for transmission by the feed forward unit.

9. A method for controlling power ramping, the method comprising:
starting a data unit to produce a specified value;
starting power ramp up with closed loop power control; and
in response to a determining that the power ramp up is complete, disabling closed loop power control, enabling ramp path power control, and starting power ramp down, comprising applying a sequence of subtractive values to a multiplicative correction value created by the ramp path power control.

10. A method for controlling power ramping, the method comprising:
starting a data unit to produce a specified value;
starting power ramp up with closed loop power control; and
in response to a determining that the power ramp up is complete, disabling closed loop power control, enabling ramp path power control, and starting power ramp down, comprising applying a decaying function to a multiplicative correction value created by the ramp path power control.

11. A method for controlling power ramping, the method comprising:
starting a data unit to produce a specified value;
starting power ramp up with closed loop power control; and
in response to a determining that the power ramp up is complete, disabling closed loop power control, enabling ramp path power control, and starting power ramp down, comprising:
retaining a value in an accumulator of a control loop;
disabling ramp path power control; and
adjusting control loop gain until power ramp down is complete.

12. The method of claim 11, wherein starting power ramp down further comprises:
prior to disabling ramp path power control, disabling additive correction provided by closed loop power control; and
after disabling ramp path power control, enabling additive correction provided by closed loop power control.

13. A method for controlling output power level in a transmitter, the method comprising:
determining a signal related to the output power level of the transmitter;
correcting the signal; in response to a determining that the signal differs from a desired output power level by more than a threshold, using closed loop power control to compute an additive correction signal used to adjust a control signal affecting the output power level, and applying the additive correction signal to the control signal; and
in response to a determining that the signal differs from the specified value by less than the threshold, disabling closed loop power control, saving the additive correction signal, using a mathematical formula to compute a multiplicative correction signal used to adjust the control signal affecting the output power level, and applying the multiplicative correction signal as a correction to the power control signal to be used for power scaling during data transmission so that there is relatively no glitch in the signal.

14. A power control loop comprising:
a feed forward unit coupled to a data unit, the feed forward unit configured to process a data stream from the data unit for transmission;
a feedback unit coupled to the feed forward unit, the feedback unit configured to generate a feedback signal representative of an output power level of the data stream processed for transmission by the feed forward unit;
a closed loop power control unit coupled to the feedback unit and to the feed forward unit, the closed loop power control unit configured to generate an additive correction signal based on an error signal computed from the feedback signal; and
a ramp path power control unit coupled to the data unit, the ramp path power control unit configured to generate a multiplicative correction signal based on an additive correction signal.

15. A power control loop comprising:
a feed forward unit coupled to a data unit, the feed forward unit configured to process a data stream from the data unit for transmission;
a feedback unit coupled to the feed forward unit, the feedback unit configured to generate a feedback signal representative of an output power level of the data stream processed for transmission by the feed forward unit; and
a closed loop power control unit coupled to the feedback unit and to the feed forward unit, the closed loop power control unit configured to generate an additive correction signal based on an error signal computed from the feedback signal, wherein the additive correction signal is further generated based on the data stream from the data unit, and wherein a multiplicative correction signal is further generated based on the data stream from the data unit.

16. A power control loop comprising:
a feed forward unit coupled to a data unit, the feed forward unit configured to process a data stream from the data unit for transmission;
a feedback unit coupled to the feed forward unit, the feedback unit configured to generate a feedback signal representative of an output power level of the data stream processed for transmission by the feed forward unit; and
a closed loop power control unit coupled to the feedback unit and to the feed forward unit, the closed loop power control unit configured to generate an additive correction signal based on an error signal computed from the feedback signal, wherein the data unit comprises a signal processor configured to convert a data stream in Cartesian coordinate form into a data stream in either polar coordinate or amplitude form to be used for the closed loop power control.

17. A power control loop comprising:
a feed forward unit coupled to a data unit, the feed forward unit configured to process a data stream from the data unit for transmission;
a feedback unit coupled to the feed forward unit, the feedback unit configured to generate a feedback signal representative of an output power level of the data stream processed for transmission by the feed forward unit;
a closed loop power control unit coupled to the feedback unit and to the feed forward unit, the closed loop power control unit configured to generate an additive correction signal based on an error signal computed from the feedback signal; and a processor coupled to the feed forward unit, to the feedback unit, and to the closed loop power control unit, the processor configured to control the operation of the closed loop power control unit using algorithms to adjust operating parameters based on operating conditions.

* * * * *